United States Patent
Endres

(10) Patent No.: US 9,897,924 B2
(45) Date of Patent: Feb. 20, 2018

(54) ILLUMINATION OPTICAL UNIT FOR PROJECTION LITHOGRAPHY

(71) Applicant: Carl Zeiss SMT GmbH, Oberkochen (DE)

(72) Inventor: Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/212,664

(22) Filed: Jul. 18, 2016

(65) Prior Publication Data

US 2016/0327868 A1    Nov. 10, 2016

Related U.S. Application Data

(63) Continuation of application No. PCT/EP2015/053174, filed on Feb. 16, 2015.

(30) Foreign Application Priority Data

Feb. 21, 2014   (DE) ........................ 10 2014 203 187

(51) Int. Cl.
G03B 27/54   (2006.01)
G03F 7/20    (2006.01)

(52) U.S. Cl.
CPC .......... *G03F 7/702* (2013.01); *G03F 7/70075* (2013.01); *G03F 7/70116* (2013.01)

(58) Field of Classification Search
CPC ........................ G03F 7/70075; G03F 7/70016
(Continued)

(56) References Cited

U.S. PATENT DOCUMENTS 5,963,305 A    10/1999   Mizouchi
6,195,201 B1   2/2001    Koch et al.
(Continued)

FOREIGN PATENT DOCUMENTS

CN     1774675 A      5/2006
CN    102422225 A     4/2012
(Continued)

OTHER PUBLICATIONS

German Office Action, with translation thereof, for corresponding DE Appl No. 10 2014 203 187.7, dated Oct. 8, 2014.
(Continued)

*Primary Examiner* — Hung Henry Nguyen
(74) *Attorney, Agent, or Firm* — Fish & Richardson P.C.

(57) ABSTRACT

An illumination optical unit for projection lithography serves for illuminating an object field. A first transmission optical unit serves to guide illumination light emanating from a light source. An illumination-predetermining facet mirror is disposed downstream of the first transmission optical unit and comprises a multiplicity of illumination-predetermining facets. The facet mirror generates a predetermined illumination of the object field via an arrangement of illuminated illumination-predetermining facets. This results in an illumination of an illumination pupil of the illumination optical unit, which predetermines an illumination angle distribution in the object field. The illumination pupil has an envelope deviating from a circular form. The illumination pupil is subdivided into sub-pupil regions, which are present arranged in a line-by-line and/or column-by-column manner.

21 Claims, 21 Drawing Sheets

(58) Field of Classification Search
USPC .................................. 355/52, 53, 55, 67–71
See application file for complete search history.

(56) References Cited

U.S. PATENT DOCUMENTS

| | | |
|---|---|---|
| 6,452,661 B1 | 9/2002 | Komatsuda |
| 6,507,440 B1 | 1/2003 | Schultz |
| 7,095,560 B2 | 8/2006 | Toyoda |
| 2003/0043455 A1 | 3/2003 | Singer et al. |
| 2006/0132747 A1 | 6/2006 | Singer et al. |
| 2007/0024836 A1* | 2/2007 | Singer ................ G03F 7/70158 355/67 |
| 2007/0058269 A1 | 3/2007 | Mann et al. |
| 2011/0318696 A1 | 12/2011 | Endres |
| 2013/0070221 A1 | 3/2013 | Bittner et al. |
| 2013/0128251 A1 | 5/2013 | Mann |

FOREIGN PATENT DOCUMENTS

| | | |
|---|---|---|
| CN | 103109225 A | 5/2013 |
| DE | 199 31 848 A1 | 1/2001 |
| DE | 10 2008 009 600 A1 | 8/2009 |
| DE | 10 2009 032 194 A | 4/2010 |
| DE | 10 2009 045 096 A1 | 10/2010 |
| DE | 10 2009 047 316 A1 | 12/2010 |
| DE | 10 2011 113 521 A1 | 1/2013 |
| EP | 1225481 A2 | 7/2002 |
| WO | WO 2005/015314 A2 | 2/2005 |
| WO | WO 2010/099807 A | 9/2010 |
| WO | WO 2010/099807 A1 | 9/2010 |

OTHER PUBLICATIONS

International Search Report and Written Opinion for corresponding PCT Appl No. PCT/EP2015/053174, dated May 11, 2015.
Chinese Office Action and Search Report, with translation thereof, for corresponding Appl No. 201580009540.9, dated Sep. 4, 2017.

* cited by examiner

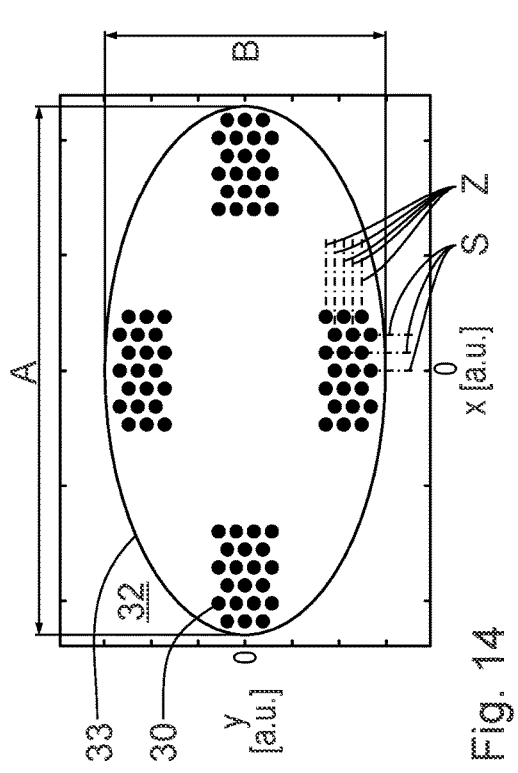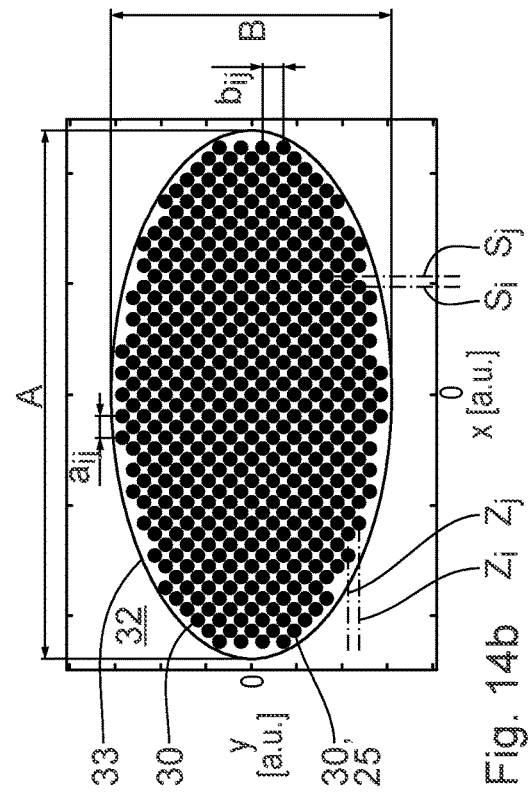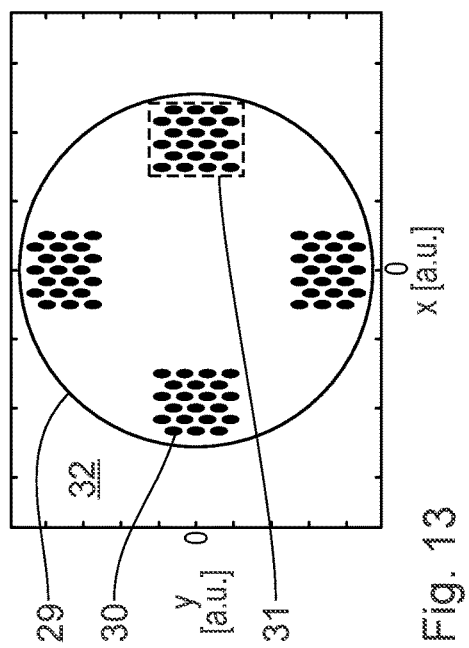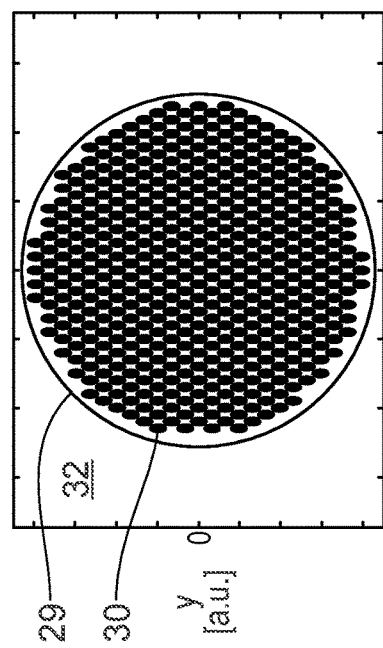
Fig. 13　Fig. 14
Fig. 14a　Fig. 14b

ILLUMINATION OPTICAL UNIT FOR PROJECTION LITHOGRAPHY

CROSS-REFERENCE TO RELATED APPLICATIONS

The present application is a continuation of, and claims benefit under 35 USC 120 to, international application PCT/EP2015/053174, filed Feb. 16, 2015, which claims benefit under 35 USC 119 of German Application No. 10 2014 203 187.7, filed Feb. 21, 2014. The entire disclosure of international application PCT/EP2015/053174 and German Application No. 10 2014 203 187.7 are incorporated by reference herein.

FIELD

The disclosure relates to a microlithographic illumination optical unit. Furthermore, the disclosure relates to an optical system including such an illumination optical unit, an illumination system including such an illumination optical unit, a projection exposure apparatus including such an optical system, a method for producing a microstructured or nanostructured component and a component produced by the method.

BACKGROUND

An illumination optical unit including a transmission optical unit and an illumination-predetermining facet mirror, disposed downstream thereof, is known from WO 2010/099807 A1 and US 2006/0132747 A1. Illumination optical units, in which the illumination-predetermining facet mirror or a corresponding refractive component is arranged in a pupil plane, are known from WO 2005/015314 A2, U.S. Pat. No. 5,963,305 and U.S. Pat. No. 7,095,560. US 2013/0128251 A1 has disclosed a projection exposure apparatus with an anamorphic projection optical unit. DE 10 2011 113 521 A1 discloses a microlithographic projection exposure apparatus. DE 10 2008 009 600 A1 discloses a facet mirror for use in a microlithographic projection exposure apparatus and a projection exposure apparatus equipped therewith. DE 199 31 848 A1 discloses astigmatic components for reducing a honeycomb aspect ratio in EUV illumination systems.

SUMMARY

The present disclosure seeks to develop an illumination optical unit in such a way that this results in an exit pupil of a downstream projection optical unit for imaging the object field in an image field being filled as completely as possible.

In one aspect, an illumination optical unit for projection lithography for illuminating an object field includes: a first transmission optical unit for guiding illumination light emanating from a light source; and an illumination-predetermining facet mirror downstream of the first transmission optical unit and including a multiplicity of illumination-predetermining facets, the facet mirror generating a predetermined illumination of the object field via an arrangement of illuminated illumination-predetermining facets, wherein an arrangement of the illumination optical unit is so that this results in an illumination, with an envelope deviating from a circular form, of an illumination pupil having a maximum extent of the illumination optical unit, which predetermines an illumination angle distribution in the object field; and the illumination pupil is subdivided into a plurality of sub-pupil regions, which are present arranged in a line-by-line (Z) and/or column-by-column (S) manner.

What was identified is that a line-by-line and/or column-by-column arrangement of sub-pupil regions in the illumination pupil leads to the possibility of, within predetermined pupil regions, tightly filling not only the illumination pupil with the envelope deviating from the circular form but also the exit pupil of a downstream projection optical unit for imaging the object field. Integrated over an object displacement, it is possible to achieve, in particular, a completely filled pupil and, within predetermined tolerances, even a homogeneously completely filled pupil.

The envelope of the illumination pupil of the illumination optical unit is a contour within which an illumination pupil of the illumination optical unit with the maximum extent can be inscribed. The illumination pupil of the illumination optical unit with the maximum extent is the illumination pupil with which the largest illumination angle bandwidth of the illumination angle distribution in the object field is generated using the illumination optical unit. To the extent that different illumination settings with different illumination angle distributions can be generated by the illumination optical unit, the illumination pupil with the largest generable area is the illumination pupil with the maximum extent. In the case of a uniform pupil filling, such a pupil with the largest area is also referred to as a conventional illumination setting.

To the extent that the illumination optical unit includes a pupil facet mirror, the envelope of a maximum impingement region of the pupil facet mirror corresponds to the envelope of the illumination pupil. The sub-pupil regions can be present in a line-by-line and column-by-column manner in a raster arrangement. The lines of this raster arrangement can extend along one of the two dimensions spanning the illumination pupil and the columns of the raster arrangement can extend along the other of these pupil dimensions spanning the illumination pupil. The lines and columns of this raster arrangement can also be rotated, for example by 45 degrees, in relation to dimensions which span the illumination pupil. One of these dimensions spanning the illumination pupil extends parallel to an object displacement direction, along which an object to be illuminated during projection lithography is displaced during the projection exposure. To the extent that the illumination optical unit is used in a scanner-illumination-projection exposure apparatus, the object displacement direction is the scanning direction. The arrangement of the first transmission optical unit and of the illumination-predetermining facet mirror can be such that an illumination of the illumination pupil of the illumination optical unit, which predetermines the illumination distribution in the object field, results with an envelope deviating from a circular form. Alternatively or additionally, the envelope of the illumination pupil, deviating from the circular form, can also be generated by a further transmission optical unit disposed downstream of the illumination-predetermining facet mirror.

An object to be illuminated is arrangeable in the object field which is illuminated by the illumination optical unit. During the projection exposure, this object is displaceable along an object displacement direction. The object field is spanned by object field coordinates x and y, wherein the y-coordinate extends parallel to the object displacement direction. An x/y-aspect ratio of the envelope of the illumination pupil with the maximum extent can be greater than 1 and can, in particular, be greater than 1.1, can be greater than 1.2, can be greater than 1.25, can be greater than 1.5, can be greater than 1.75 and can, for example, equal 2.

The illumination-predetermining facet mirror can be configured as a pupil facet mirror which includes a plurality of pupil facets and which is arranged in a pupil plane of the illumination optical unit or in a plane conjugate thereto, which pupil facets predetermine the sub-pupil regions in the illumination pupil. A field facet mirror arranged in a field plane of the illumination optical unit can be part of the first transmission optical unit. Field facets of such a field facet mirror can be subdivided into a plurality of individual mirrors, in particular into a plurality of MEMS mirrors. In the case of a pupil facet mirror embodiment of the illumination optical unit, an arrangement of the pupil facets corresponds to the arrangement of the sub-pupil regions. Correspondingly, the arrangement of the pupil facets is then present in a corresponding line-by-line and/or column-by-column manner. On their part, such pupil facets can in turn be made up of a plurality of individual mirrors, for example a plurality of MEMS mirrors. As a result, the etendue that is usable overall for a downstream projection optical unit can be optimized.

The predetermined illumination of the object field is predetermined as predetermined illumination of a field form and an illumination angle distribution of the object field via: an illuminable edge form of the illumination-predetermining facet mirror; and individual tilt angles of the illumination-predetermining facets. Such an illumination optical unit constitutes an alternative to the embodiment with a pupil facet mirror. This alternative embodiment, in which the illumination-predetermining facet mirror is arranged at a distance from a pupil plane of the illumination optical unit, is also known as a specular reflector.

An arrangement that the envelope of the illumination pupil can have a maximum extent (A) in a first pupil dimension (x) and a minimum extent (B) in a second pupil dimension (y), where-in a ratio between the maximum extent (A) and the minimum extent (B) is at least 1.1. Such a configuration of the illumination pupil allows compensation of an anamorphic effect of a downstream projection optical unit. The ratio between the maximum and the minimum extent, which corresponds to the x/y-aspect ratio of the envelope discussed above, can be at least 1.2, can be at least 1.4, can be at least 1.5, can be at least 1.7, can be at least 2, can be at least 2.5, can be at least 3, can be at least 3.5, can be at least 4 and can be even larger. The transmission optical unit and the illumination-predetermining facet mirror of the illumination optical unit can be arranged in such a way that the sub-pupil regions in the two pupil dimensions have the same spacing from one another. Alternatively, the transmission optical unit and the illumination-predetermining facet mirror of the illumination optical unit can be arranged in such a way that the sub-pupil regions are spaced further from one another in the pupil dimension with the maximum extent than in the pupil dimension with the minimum extent.

The sub-pupil regions of one of the columns of the arrangement can be arranged offset from one another relative to the sub-pupil regions of an adjacent column of the arrangement by half the spacing of sub-pupil regions adjacent to one another within a column. Such an offset arrangement of the sub-pupil regions enables further compacting of the sub-pupil regions in the illumination pupil. The sub-pupil regions of one of the lines of the arrangement can be arranged offset from one another relative to the sub-pupil regions of an adjacent line of the arrangement by half the spacing of sub-pupil regions adjacent to one another within a line. By way of example, a rotated Cartesian arrangement of the sub-pupil regions or else a hexagonal arrangement of the sub-pupil regions may then emerge, depending on the spacings of the sub-pupil regions within a column and within a line, i.e. depending on the grid constants of such a line-by-line and column-by-column arrangement.

The sub-pupil regions of adjacent lines can partly overlap one another in a direction perpendicular to the extent of the line, which further increases the compactness of the arrangement of the sub-pupil regions in the illumination pupil. A corresponding statement applies to a possible overlap of the columns.

The sub-pupil regions in the illumination pupil can have a maximum extent in a first sub-pupil dimension and a minimum extent in a second sub-pupil dimension, wherein a ratio between the maximum extent and the minimum extent is at least 1.1. such an aspect ratio deviating from 1 of the sub-pupil regions, even in the illumination pupil, can be used for pre-compensation of an anamorphic effect of a projection optical unit, which is arranged downstream from the illumination optical unit. The aspect ratio of the sub-pupil regions can be pre-set in such a way that e.g. round sub-pupil regions then emerge in an exit pupil of the projection optical unit as a result of the subsequent anamorphic effect of this projection optical unit. The ratio between the maximum extent and the minimum extent of the sub-pupil regions can be at least 1.2, can be at least 1.4, can be at least 1.5, can be at least 1.7, can be at least 2, can be at least 2.5, can be at least 3, can be at least 3.5, can be at least 4 and can be even larger. In particular, the sub-pupil regions can have an elliptical embodiment. The aspect ratio can either be due to the light source or can be caused via a transmission optical unit, for example via anamorphic imaging within the illumination optical unit. The sub-pupil dimension with the maximum extent of the sub-pupil regions can extend parallel to the pupil dimension with the maximum extent of the envelope of the illumination pupil.

The first transmission optical unit can include a transmission facet mirror with a plurality of transmission facets. Such transmission facets can be embodied monolithically or as groups of individual MEMS mirrors. The transmission facets or transmission facet groups can be embodied as cylindrical optical units. This can make a contribution to a desired anamorphic image of the illumination optical unit.

An envelope of the transmission facet mirror can have a maximum extent in a first field dimension and a minimum extent in a second field dimension, wherein a ratio between the maximum extent and the minimum extent is at least 1.1. Such an aspect ratio of the envelope of the transmission facet mirror can be advantageous when the transmission facet mirror is part of anamorphic imaging of the illumination optical unit. The maximum field dimension can extend parallel to the minimum pupil dimension. The minimum field dimension can extend parallel to the maximum pupil dimension.

The transmission optical unit can include a collector which generates an anamorphic image of the light source on the illumination pupil of the illumination optical unit. Such a collector was found to be particularly suitable for the predetermination of an anamorphic imaging effect of the illumination optical unit. This saves an additional component of the illumination optical unit. Anamorphic imaging of such a collector can generate sub-pupil regions deviating from rotational symmetry, in particular elliptical sub-pupil regions. The collector can include a collector subunit which generates a secondary intermediate image of the light source in the beam path of the illumination light. The collector can include at least one further collector subunit which generates a further intermediate image in the pupil plane of the illumination pupil. The secondary intermediate image can be rotationally symmetric. The collector can include collector subunits or collector components which are realized by NI mirrors and/or by GI mirrors. At least one of the collector subunits can be configured as a Wolter collector unit. By way of example, Wolter optical units are described in US 2003/0043455 A1 and in the citations specified there. The collector can also generate an intermediate image of the light source deviating from rotational symmetry as the first intermediate image. Such an intermediate image can then be imaged in the pupil plane of the illumination pupil by further components of the transmission optical unit.

A further transmission optical unit can be disposed downstream of the illumination-predetermining facet mirror for generating the illumination pupil. Such a further transmission optical unit increases the number of degrees of freedom when designing the optical components of the illumination optical unit. The further transmission optical unit can be embodied as anamorphic optical unit. Alternatively, an already non-rotationally symmetric image of the light source can be imaged via the further transmission optical unit. The further transmission optical unit can be embodied by a rotationally symmetric telescopic optical unit. Alternatively, the transmission optical unit can include at least one cylinder component.

The advantages of an optical system including an illumination optical unit described above and a projection optical unit for imaging the object field in an image field, an illumination system including an illumination optical unit described above, a projection exposure apparatus including such an optical system and a light source, a production method involving the use of such a projection exposure apparatus correspond to those which were already discussed above with reference to the illumination optical unit.

BRIEF DESCRIPTION OF THE DRAWINGS

Exemplary embodiments of the disclosure are explained in detail below on the basis of the drawing. In the latter:

FIGS. 13 and 14 show sub-pupil arrangements, corresponding to FIGS. 3 and 4, for a further illumination setting of the projection exposure apparatus, wherein an alternative packing of the sub-pupil regions is depicted;

FIGS. 14a and 14b show sub-pupil arrangements, corresponding to FIGS. 3 and 4, for a further illumination setting of the projection exposure apparatus, wherein an alternative packing of the sub-pupil regions, which is generated by rotating a Cartesian xy-grid of the sub-pupil regions in the illumination pupil by 45°, is depicted;

FIG. 23 a/b very schematically show a lens portion of a further embodiment of the illumination optical unit including an illumination-predetermining facet mirror, not arranged in an illumination pupil, of the illumination optical unit and a downstream transmission optical unit in the form of a cylindrical optical unit; wherein

DETAILED DESCRIPTION

Figure 1:
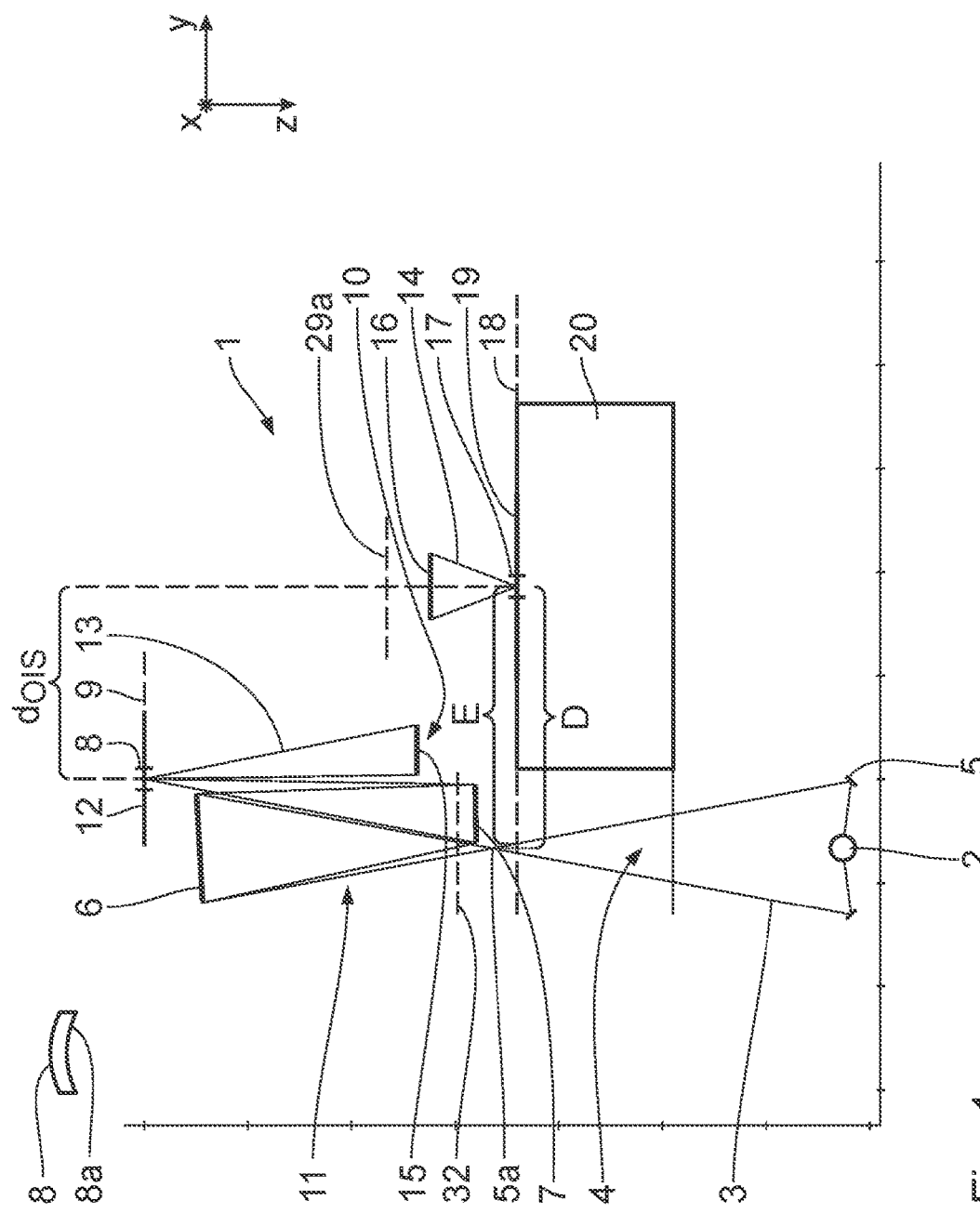
FIG. 1 shows, very schematically, a projection exposure apparatus for EUV microlithography in a meridional section, including a light source, an illumination optical unit and a projection optical unit.

A microlithographic projection exposure apparatus 1, depicted very schematically and in a meridional section in FIG. 1, includes a light source 2 for illumination light 3. The light source is an EUV light source which generates light in a wavelength range between 5 nm and 30 nm. Here, this can be an LPP (laser produced plasma) light source, a DPP (discharge produced plasma) light source or a synchrotron radiation-based light source, for example a free electron laser (FEL).

A transmission optical unit 4 serves to guide the illumination light 3 emanating from the light source 2. The transmission optical unit includes a collector 5, merely depicted in FIG. 1 in respect of its reflective effect, and a transmission facet mirror 6, which is also referred to as first facet mirror and described in more detail below. An intermediate focus 5a of the illumination light 3 is arranged between the collector 5 and the transmission facet mirror 6. A numerical aperture of the illumination light 3 in the region of the intermediate focus 5a is e.g. NA=0.182. An illumination-predetermining facet mirror 7, which is likewise still explained in more detail below, is disposed downstream of the transmission facet mirror 6 and hence downstream of the transmission optical unit 4. As will likewise be explained in more detail below, the illumination-predetermining facet mirror 7 can be arranged in, or in the region of, a pupil plane of the illumination optical unit 11 in one embodiment of the illumination optical unit 11 and can also be arranged at a distance from the pupil plane or the pupil planes of the illumination optical unit 11 in a further embodiment of the illumination optical unit 11.

A reticle 12, which is arranged in an object plane 9 of a downstream projection optical unit 10 of the projection exposure apparatus 1, is disposed downstream of the illumination-predetermining facet mirror 7 in the beam path of the illumination light 3. The projection optical unit 10 and the projection optical units of the further embodiments described below respectively are a projection lens.

A Cartesian xyz-coordinate system is used below so as to simplify the illustration of positional relationships. In FIG. 1, the x-direction extends perpendicular to the plane of the drawing and into the latter. In FIG. 1, the y-direction extends to the right. In FIG. 1, the z-direction extends downwards. Coordinate systems used in the drawing respectively have x-axes extending parallel to one another. The extent of a z-axis of these coordinate systems follows a respective main direction of the illumination light 3 within the respectively considered figure.

The optical components 5 to 7 are constituents of an illumination optical unit 11 of the projection exposure apparatus 1. The illumination optical unit 11 is used to illuminate an object field 8 on the reticle 12 in the object plane 9 in a defined manner. The object field 8 has an arcuate or partial circle-shaped form and is delimited by two circular arcs, parallel to one another, and two straight side edges which extend in the y-direction with a length $y_0$ and which have a spacing of $x_0$ in the x-direction. The aspect ratio $x_0/y_0$ is 13 to 1. An insert in FIG. 1 shows a plan view (not to scale) of the object field 8. An edge form 8a is arcuate. In the case of an alternative and likewise possible object field 8, the edge form thereof is rectangular.

The projection optical unit 10 is merely indicated in part and very schematically in FIG. 1. What is depicted is an object field-side numerical aperture 13 and an image field-side numerical aperture 14 of the projection optical unit 10. Further optical components (not depicted in FIG. 1) of the projection optical unit 10 for guiding the illumination light 3 between the optical components 15, 16 are situated between these indicated optical components 15, 16 of the projection optical unit 10, which, for example, can be embodied as mirrors that reflect the EUV illumination light 3.

The projection optical unit 10 images the object field 8 in an image field 17 in an image plane 18 on a wafer 19 which, like the reticle 12 as well, is carried by a holder not depicted in any more detail. Both the reticle holder and the wafer holder are displaceable both in the x-direction and the y-direction via appropriate displacement drives. In FIG. 1, installation space of the wafer holder are depicted at 20 as a rectangular box. The installation space 20 are rectangular with an extent in the x-, y- and z-direction that is dependent on the components to be housed therein. By way of example, proceeding from the centre of the image field 17, the installation space 20 have an extent of 1 m in the x-direction and in the y-direction. Proceeding from the image plane 18, the installation space 20 also have an extent of e.g. 1 m in the z-direction. The illumination light 3 is guided in the illumination optical unit 11 and in the projection optical unit 10 in such a way that it is in each case guided past the installation space 20.

Figure 2:
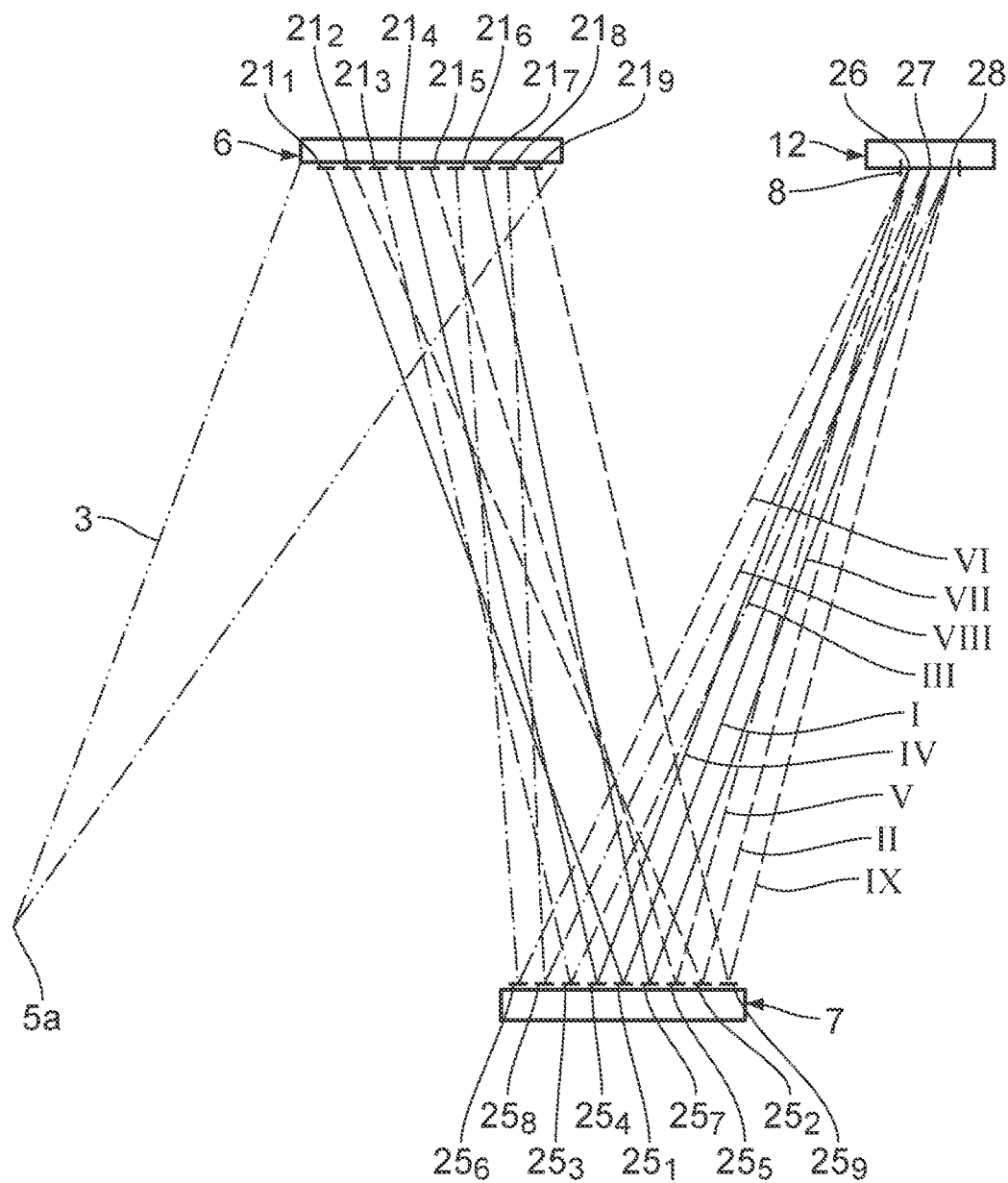
FIG. 2 shows, schematically and likewise in a meridional section, a beam path for selected individual rays of illumination light within the illumination optical unit according to FIG. 1, proceeding from an intermediate focus to a reticle arranged in the object plane of the projection optical unit.

The transmission facet mirror 6 has a plurality of transmission facets 21. The transmission facet mirror 6 can be configured as a MEMS mirror. Of these transmission facets 21, the meridional section according to FIG. 2 schematically shows a line with a total of nine transmission facets 21, which, from left to right, are denoted by 211 to 219 in FIG. 2. In actual fact, the transmission facet mirror 6 has a substantially larger multiplicity of transmission facets 21. The transmission facets 21 are grouped into a plurality of transmission facet groups not depicted in any more detail.

Overall, the transmission facet mirror 6 has a region which is impinged by the illumination light 3 and can have an x/y-aspect ratio of less than 1. The value y/x of this aspect ratio may be at least 1.1 or be even larger.

In one embodiment of the illumination optical unit with an illumination-predetermining facet mirror 7 arranged in a pupil plane, an x/y-aspect ratio of the transmission facet groups at least has the same size as the x/y-aspect ratio of the object field 8. In the depicted embodiment, the x/y-aspect ratio of the transmission facet groups is greater than the x/y-aspect ratio of the object field 8. The transmission facet groups have a partial circle-shaped bent group edge form which is similar to the edge form of the object field 8. In respect of further details in relation to the design of the transmission facet mirror 6, reference is made to WO 2010/099 807 A.

The transmission facet groups which are formed by grouping the transmission facets 21 or the monolithic facets corresponding to these facet groups can have an extent of 70 mm in the x-direction and of approximately 4 mm in the y-direction.

By way of example, each transmission facet group is arranged in 16 columns which are arranged offset from one another in the x-direction and respectively consist of seven lines of transmission facets 21 arranged adjacently in the y-direction. Each one of the transmission facets 21 is rectangular.

Each one of the transmission facet groups guides a portion of the illumination light 3 for partial or complete illumination of the object field 8.

The transmission facets 21 are micromirrors that are switchable between at least two tilt positions. The transmission facets 21 can be embodied as micromirrors that are tiltable about two mutually perpendicular axes of rotation. The transmission facets 21 are aligned in such a way that the illumination-predetermining facet mirror 7 is illuminated with a predetermined edge form and a predetermined association between the transmission facets 21 and illumination-predetermining facets 25 of the illumination-predetermining facet mirror 7. In respect of further details in relation to the embodiment of the illumination-predetermining facet mirror 7 and the projection optical unit 10, reference is made to WO 2010/099 807 A. The illumination-predetermining facets 25 are micromirrors that are switchable between at least two tilt positions. The illumination-predetermining facets 25 can be embodied as micromirrors which are continuously and independently tiltable about two mutually perpendicular tilt axes, i.e. which can be put into a multiplicity of different tilt positions, particularly if the illumination-predetermining facet mirror 7 is arranged at a distance from a pupil plane of the illumination optical unit.

An example for the predetermined association between the transmission facets 21 and the illumination-predetermining facets 25 is depicted in FIG. 2. The illumination-predetermining facets 25 respectively associated with the transmission facets $21_1$ to $21_9$ have an index corresponding to this association. As a result of this association, the illumination facets 25 are illuminated from left to right in the sequence $25_6$, $25_8$, $25_3$, $25_4$, $25_1$, $25_7$, $25_5$, $25_2$ and $25_9$.

The indices 6, 8 and 3 of the facets 21, 25 are associated with three illumination channels VI, VIII and III, which illuminate three object field points 26, 27, 28, which are numbered from left to right in FIG. 2, from a first illumination direction. The indices 4, 1 and 7 of the facets 21, 25 are associated with three further illumination channels IV, I, VII, which illuminate the three object field points 26 to 28 from a second illumination direction. The indices 5, 2 and 9 of the facets 21, 25 are associated with three further illumination channels V, II, IX, which illuminate the three object field points 26 to 28 from a third illumination direction.

The illumination directions which are assigned to
the illumination channels VI, VIII, III,
the illumination channels IV, I, VII and
the illumination channels V, II, IX
are identical in each case. Therefore, the transmission facets 21 are assigned to the illumination-predetermining facets 25 in such a way that a telecentric illumination of the object field 8 results in the illumination example depicted by way of a figure.

The object field 8 is illuminated by the transmission facet mirror 6 and the illumination-predetermining facet mirror 7 in the style of a specular reflector. The principle of the specular reflector is known from US 2006/0132747 A1.

The projection optical unit 10 has an object/image offset do's of 930 mm. The latter is defined as the distance of a centre point of the object field 8 from an intersection point of a normal on the centre point of the image field 17 through the object plane 9. The projection exposure apparatus 1 with the projection optical unit 10 has an intermediate focus/image offset D of 1280 mm. The intermediate focus/image offset D is defined as the distance of the centre point of the image field 17 from an intersection point of a normal of the intermediate focus 5*a* on the image plane 18. The projection exposure apparatus 1 with the projection optical unit 10 has an illumination light beam/image offset E of 1250 mm. The illumination light beam/image offset E is defined as the distance of the centre point of the image field 17 from an intersection region of the illumination light beam 3 through the image plane 18.

The projection optical unit 10 has an entry pupil with an envelope deviating from a circular form. Simultaneously, the projection optical unit 10 is embodied as an anamorphic optical unit such that this entry pupil is transferred to an image field-side exit pupil, the envelope of which is rotationally symmetric. A pupil plane, in which the exit pupil of the projection optical unit 10 lies, is indicated schematically in FIG. 1 at 29*a*.

Figure 3:
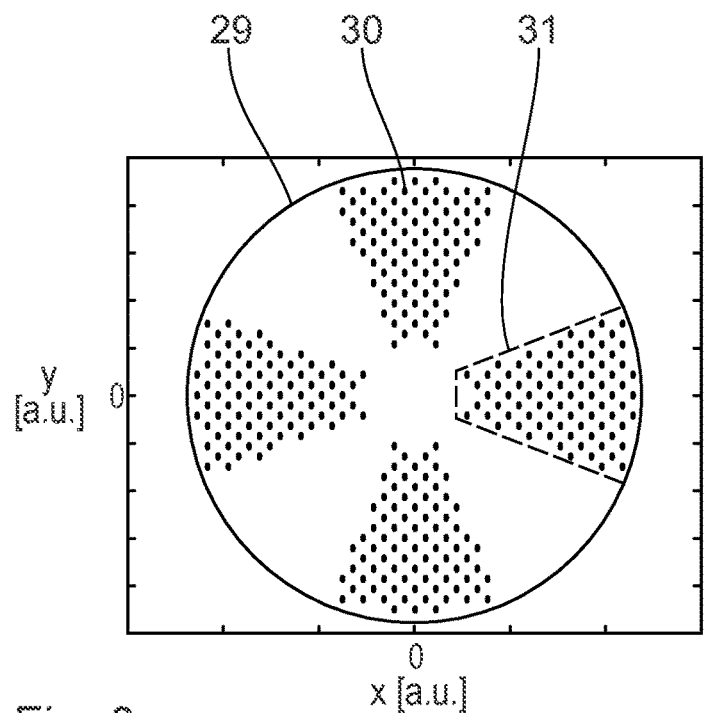
FIG. 3 shows an arrangement of sub-pupil regions, generated by the illumination optical unit, in an exit pupil in an exit-side pupil plane of the projection optical unit.

An example for such a rotationally symmetric, i.e., in particular, circular, envelope 29 of the exit pupil of the projection optical unit 10 is depicted in FIG. 3. Within this envelope 29, the illumination light 3 can be guided as imaging light in the projection optical unit 10. Sub-pupil regions 30, within which the illumination light 3 is guided, are depicted. That is to say, the sub-pupil regions 30 represent illumination channels of the illumination optical unit 11. The sub-pupil regions 30 are grouped to form poles 31 in the style of a quadrupole illumination setting for exposing the wafer 19. The poles 31 according to FIG. 3 have an approximately circular sector-shaped form and respectively cover a circumferential angle of approximately 45°. The individual poles 31 of this quadrupole illumination setting emerge as envelope of raster-like arranged groups of the sub-pupil regions 30. Within these groups, the sub-pupil regions 30 are arranged in a line-by-line and column-by-column manner.

Figure 4:
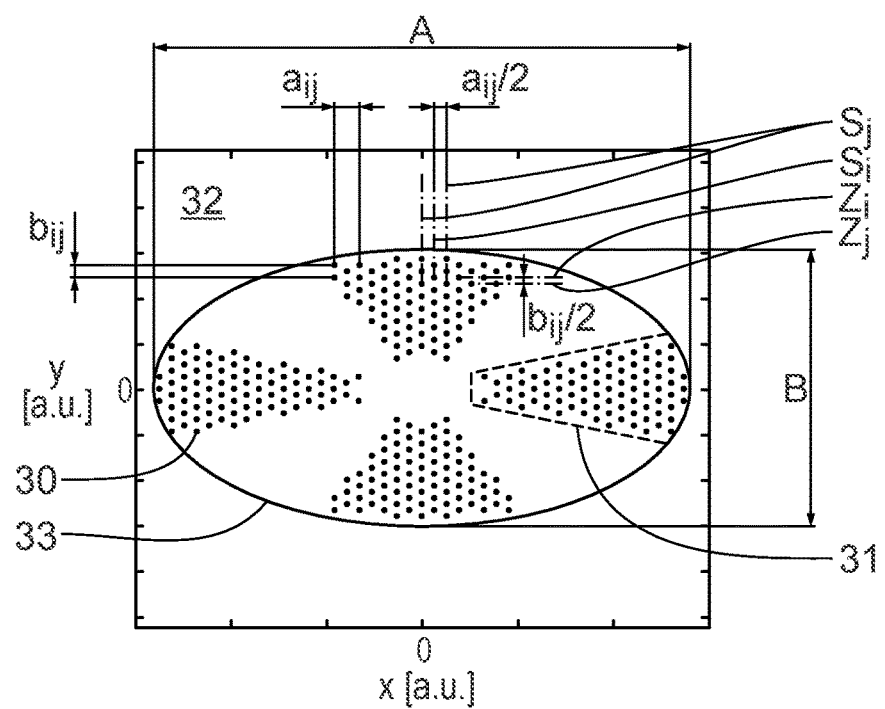
FIG. 4 shows an arrangement of the sub-pupil regions, belonging to the arrangement of the sub-pupil regions according to FIG. 3, in a pupil plane of an illumination pupil of the illumination optical unit.

FIG. 4 shows an arrangement of the sub-pupil regions 30 in an illumination pupil of the illumination optical unit 11, which further down along the beam path of the illumination light 3 leads to the arrangement of the sub-pupil regions 30 according to FIG. 3.

A pupil plane, in which the illumination pupil of the illumination optical unit lies, is indicated schematically in FIG. 1 at 32. This illumination pupil plane 32 is at a distance from an arrangement plane of the illumination-predetermining facet mirror 7 in the embodiment according to FIG. 1.

In an alternative illumination optical unit, the illumination pupil plane 32 coincides with the arrangement plane of the illumination-predetermining facet mirror. In this case, the illumination-predetermining facet mirror 7 is a pupil facet mirror. In this case, the illumination-predetermining facets 25 are embodied as pupil facets. Here, this can relate to monolithic pupil facets or else to mirror groups subdivided into a plurality of micromirrors. Such a pupil facet mirror as part of an illumination optical unit is known from e.g. U.S. Pat. No. 6,452,661, U.S. Pat. No. 6,195,201 and DE 10 2009 047 316 A1.

The illumination pupil according to FIG. 4 is generated by a variant of the illumination optical unit 10, in which the illumination-predetermining facet mirror 7 is embodied as a pupil facet mirror.

The illumination pupil of the illumination optical unit 11 according to FIG. 4 is adapted to the entry pupil of the projection optical unit 10 and, in accordance with this adaptation, has an envelope 33 which deviates from a circular form.

The envelope 33 of the illumination pupil of the illumination optical unit 11 is a contour within which an illumination pupil of the illumination optical unit 11 with the maximum extent can be inscribed. The illumination pupil of the illumination optical unit 11 with the maximum extent is the illumination pupil with which a largest illumination angle bandwidth of the illumination angle distribution in the object field 8 is generated using the illumination optical unit 11. To the extent that different illumination settings with different illumination angle distributions can be generated by the illumination optical unit 11, the illumination pupil with the largest generable area is the illumination pupil with the maximum extent. In the case of a uniform pupil filling, such a pupil with the largest area is also referred to as a conventional illumination setting.

In the embodiment according to FIG. 4, the envelope 33 has an elliptical form. In accordance with this adaptation, the poles 31 are also compressed in the y-direction compared to the form in the exit pupil according to FIG. 3. In the illumination pupil according to FIG. 4, the sub-pupil regions 30 are circular and emerge as images of the light source 2. In the case of a light source 2 with a rotationally symmetric used-light emission surface, this accordingly results in the circular form of the sub-pupil regions 30 in the illumination pupil of the illumination optical unit 11 in the case of non-anamorphic imaging.

The anamorphic projection optical unit 10 leads to the sub-pupil regions 30 being elliptically distorted in the exit pupil of the projection optical unit and having a greater extent in the y-direction than in the x-direction, as depicted in FIG. 3.

The envelope 33 of the illumination pupil has a maximum extent A in a first pupil dimension, namely in the x-direction, and has a minimum extent B in a second pupil dimension, namely in the y-direction. The ratio of extent A/B, i.e. an x/y-aspect ratio, of the envelope 33 corresponds to the ratio of the anamorphic imaging scales of the projection optical unit. In the projection optical unit 10, these imaging scales are a reduced imaging scale $\beta_y$ of ⅛ in the yz-plane and a reduced imaging scale $\beta_x$ of ¼ in the xz-plane. What emerges is $\beta_x/\beta_y=A/B=2$. Other ratios in the range between 1.05 and 5, in particular in the range between 1.2 and 3, are also possible.

The arrangement of the sub-pupil regions 30 within the illumination pupil according to FIG. 4 is such that the sub-pupil regions 30 are spaced further from one another in the pupil dimension with the maximum extent A than in the pupil dimension with the minimum extent B. This distance ratio adapts within the exit pupil of the projection optical unit 10 to a ratio of approximately 1:1 (cf. FIG. 3).

The arrangement of the sub-pupil regions 30 in the illumination pupil is a raster arrangement with lines Z and columns S. The distance between adjacent lines $Z_i$, $Z_j$ in this case approximately corresponds to the extent of the sub-pupil regions 30. The distance between adjacent columns is a multiple of the extent of the individual sub-pupil regions 30.

The sub-pupil regions 30 of adjacent lines $Z_i$, $Z_j$ are arranged offset from one another by half a line spacing $a_{ij}$ of adjacent sub-pupil regions 30.

Figure 5:
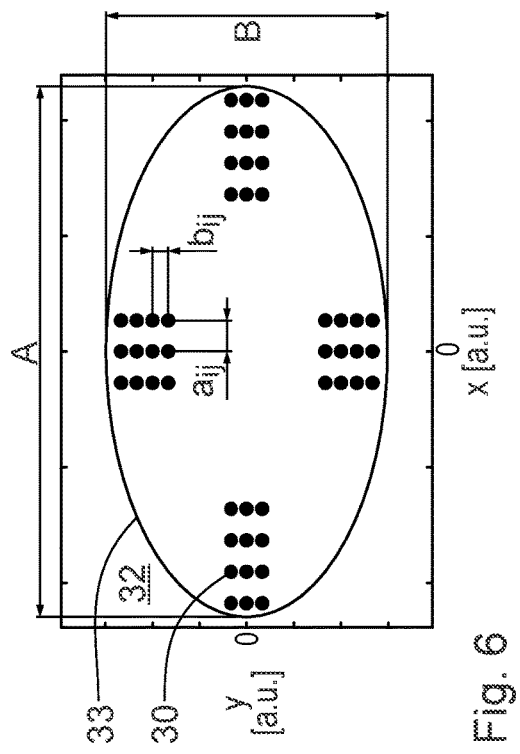
FIGS. 5 and 6 show sub-pupil arrangements, corresponding to FIGS. 3 and 4, for a further illumination setting of the projection exposure apparatus, wherein an alternative packing of the sub-pupil regions is depicted.
Figure 6:
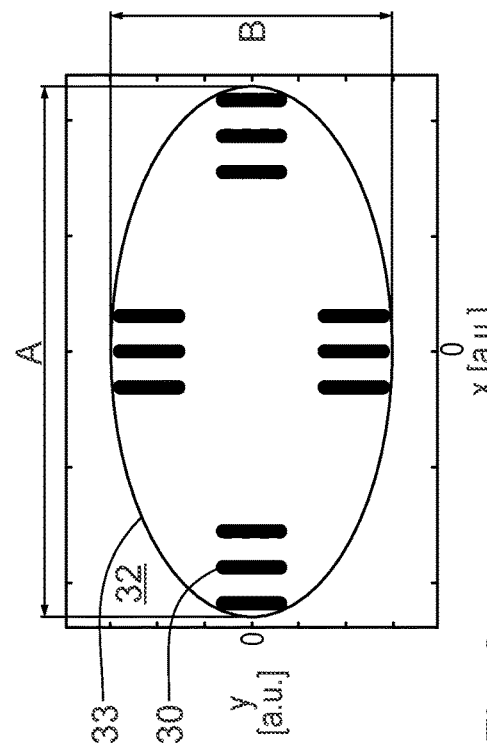

FIGS. 5 and 6 show an alternative arrangement of sub-pupil regions 30, firstly in the exit pupil of the projection optical unit 10 (cf. FIG. 5) and secondly in the illumination pupil of the illumination optical unit 11 (cf. FIG. 6) which is adapted to the entry pupil of the projection optical unit 10. Components and structure elements and also functions which correspond to those already explained above in relation to FIGS. 3 and 4 are appropriately denoted by the same reference signs and are not discussed again in detail. This also applies to the subsequent pairs of figures, which respectively show arrangements of sub-pupil regions 30, firstly in the exit pupil of the projection optical unit 10 and secondly in the illumination pupil of the illumination optical unit 11 which is adapted to the entry pupil of the projection optical unit 10.

The arrangement of the sub-pupil regions 30 according to FIGS. 5 and 6 is also generated by an illumination optical unit with an illumination-predetermining facet mirror embodied as a pupil facet mirror. The pupil facets according to FIG. 6 are rectangular. The aspect ratio of the edge lengths corresponds to the ratio of the imaging scales of the projection lens.

A variant of a quadrupole illumination setting, which differs from the setting according to FIG. 3 in the form of the envelope of the poles 31, is present in the exit pupil of the projection optical unit 10. The poles 31 according to FIG. 5 have an approximately square form, wherein a radially outer boundary of the poles 31 follows the form of the envelope 29.

In the arrangement according to FIGS. 5 and 6, the sub-pupil regions 30 are arranged in the form of a rectangular raster. A line spacing of this sub-pupil region arrangement approximately corresponds to the extent of the sub-pupil regions 30 in the illumination pupil according to FIG. 6. A column spacing is a multiple thereof.

Figure 7:
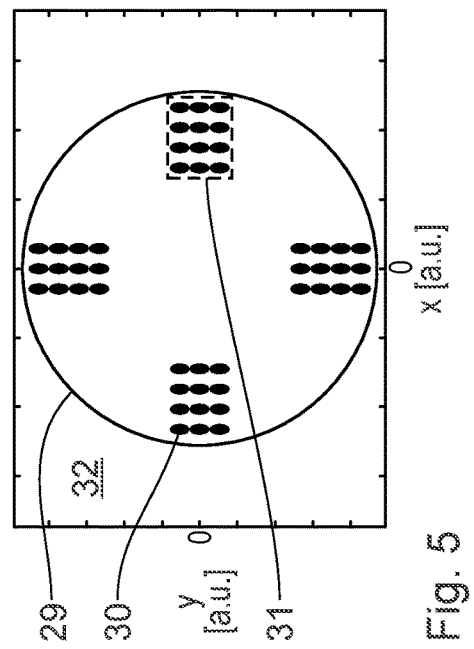
FIGS. 7 and 8 show sub-pupil arrangements, corresponding to FIGS. 3 and 4, for a further illumination setting of the projection exposure apparatus, wherein, unlike in the illumination settings according to FIGS. 3 to 6, an illumination-predetermining facet mirror of the illumination optical unit is not arranged in a pupil plane of the illumination optical unit in order to generate the arrangement according to FIGS. 7 and 8.
Figure 8:
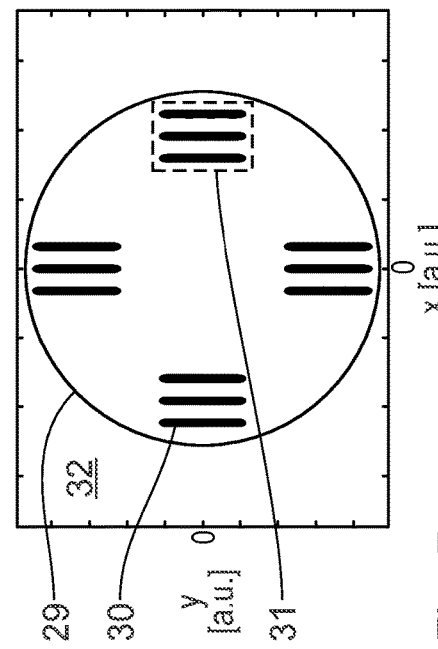

FIGS. 7 and 8 show arrangements of sub-pupil regions 30, firstly in the exit pupil of the projection optical unit 10 (FIG. 7) and secondly in the illumination pupil of the illumination optical unit 11 (FIG. 8), in the case of a quadrupole illumination setting which, in principle, corresponds to the one according to FIGS. 5 and 6. This arrangement of the sub-pupil regions 30 according to FIGS. 7 and 8 is generated by an illumination-predetermining facet mirror 7 which is not arranged in a pupil plane. An overlap of the illumination channels emerges in the pupil plane, and so the sub-pupil regions 30 merge into one another in the y-direction. Then, a line spacing of the sub-pupil regions 30 in the y-direction is less than the extent of individual sub-pupil regions 30. The column spacing of the sub-pupil regions is approximately the same size as the extent of the sub-pupil regions in the x-direction. The facets 25 of the illumination-predetermining facet mirror 7 are rectangular in FIG. 8, like the pupil facets from FIG. 6. The aspect ratio of the edge lengths corresponds to the ratio of the imaging scales of the projection lens.

Figure 9:
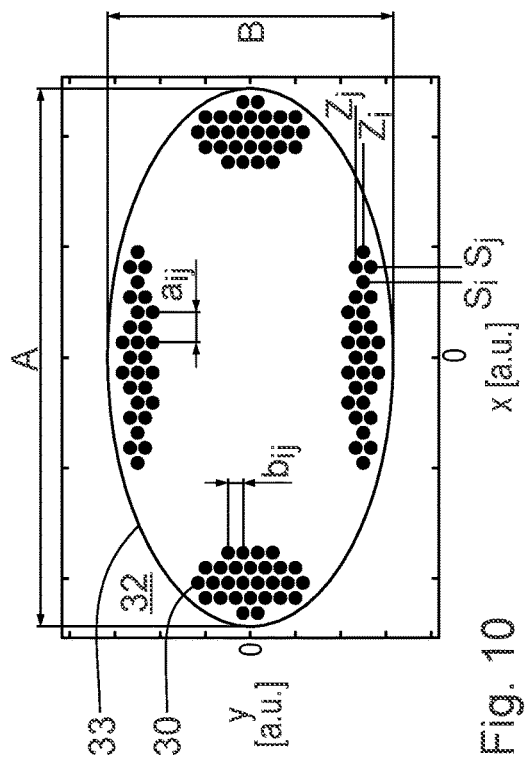
FIGS. 9 and 10 show sub-pupil arrangements, corresponding to FIGS. 3 and 4, for a further illumination setting of the projection exposure apparatus, wherein an alternative packing of the sub-pupil regions is depicted.
Figure 10:
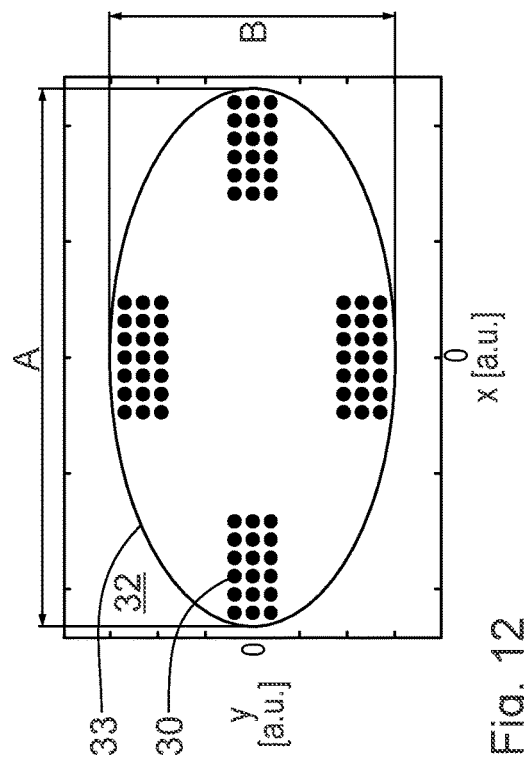

FIGS. 9 and 10 show a further arrangement variant of the sub-pupil regions 30 in the case of a further quadrupole illumination setting. In contrast to the setting according to FIG. 3, the poles 31 in the setting according to FIG. 9 are delimited in the form of cut-off circular sectors, and so a quadrupole illumination emerges with a larger minimum illumination angle compared to FIG. 3.

In the illumination pupil (cf. FIG. 10), the sub-pupil regions 30 are arranged with the spacings of adjacent lines $Z_i$, $Z_j$, which correspond to the spacing of adjacent columns $S_i$, $S_j$. Once again, the sub-pupil regions 30 of adjacent lines $Z_i$, $Z_j$ are respectively arranged offset from one another by half a spacing $a_{ij}$ of adjacent sub-pupil regions 30 within one line. The sub-pupil regions 30 can be arranged in a hexagonal grid. The facets 25 of the illumination-predetermining facet mirror 7 are round or hexagonal in this case, adapted to the form of the plasma, i.e. to the form of the light source 2.

Figure 11:
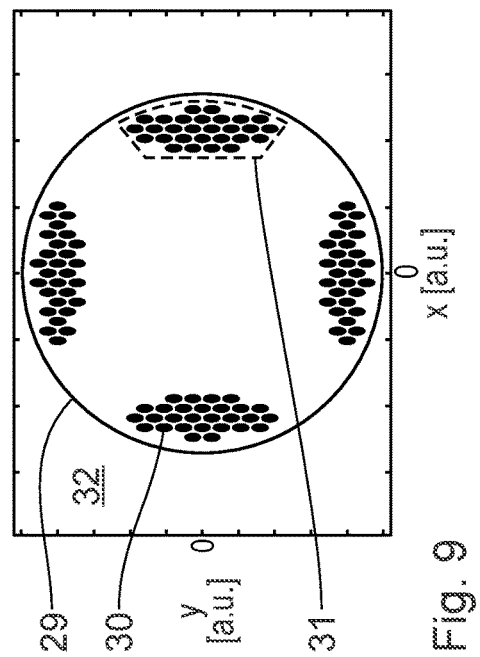
FIGS. 11 and 12 show sub-pupil arrangements, corresponding to FIGS. 3 and 4, for a further illumination setting of the projection exposure apparatus, wherein an alternative packing of the sub-pupil regions with a line-by-line offset is depicted.
Figure 12:
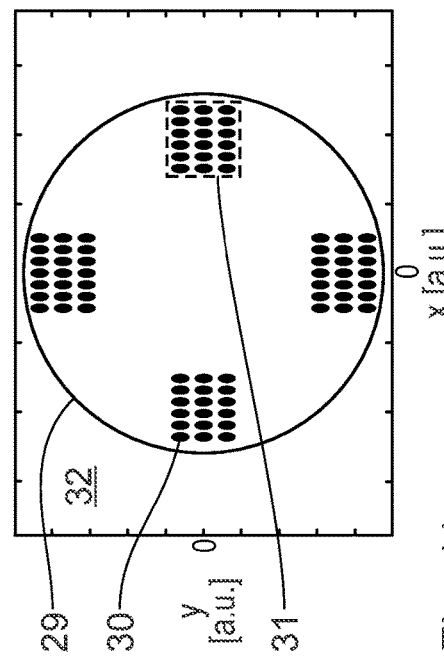

FIGS. 11 and 12 show a further arrangement of the sub-pupil regions 30, which corresponds to the one according to FIGS. 5 and 6, wherein the distances between adjacent columns of the sub-pupil region arrangement are reduced. The poles 31 have an approximately square edge contour in the exit pupil of the projection optical unit 10.

FIGS. 13 and 14 show an arrangement of the sub-pupil regions 30, otherwise corresponding to the arrangement according to FIGS. 11 and 12, wherein, in this case, the sub-pupil regions 30 of one of the lines of the raster arrangement are arranged offset from one another relative to the sub-pupil regions of an adjacent line of the raster arrangement by half a spacing $a_{ij}$ of sub-pupil regions 30 adjacent to one another within a line. This results in a very dense packing of the sub-pupil regions, even in the exit pupil, after the compression in the y-direction as a result of the anamorphic imaging effect of the projection optical unit 10 (cf. FIG. 13).

The facets 25 of the illumination-predetermining facet mirror 7 are not embodied as monolithic or macroscopic facets and can be approximated by groups of micromirrors. In this case, a line-by-line or column-by-column displacement of these virtual facets is not possible if the micromirrors are respectively combined on subunits. A displacement as described above then fails due to gaps which are present as a result of transitions between the subunits since the virtual facets cannot extend beyond the subunits. Particularly for this technical implementation of the facets 25 of the illumination-predetermining facet mirror 7, it is advantageous for these subunits, and hence also for the arrangement of the virtual facets 25, to be undertaken on a Cartesian grid which is rotated in relation to the main axes of the illumination pupil without a rotationally symmetric edge, e.g. an elliptical illumination pupil. In relation to the coordinates x and y of the pupils perpendicular and parallel to the scanning direction, this corresponds to an offset from one another of the sub-pupil regions of one of the columns $S_i$ of the arrangement relative to the sub-pupil regions 30 of an adjacent column $S_j$ of the arrangement by a half spacing $b_{ij}$ of sub-pupil regions 30 adjacent to one another within a column. As a result, an effect virtually identical to the above-described displacement can be generated in the exit pupil. This is depicted in FIGS. 14a and 14b.

These figures show a variant of an illumination of, firstly, the exit pupil of the projection optical unit 10 (FIG. 14a) and, secondly, of the associated illumination pupil of the illumination optical unit 11 (FIG. 14b), respectively for an illumination setting with a pupil filled in the most complementary manner possible. The illustration in FIGS. 14a and 14b in principle corresponds to the pupil illustrations of e.g. FIGS. 3 and 4.

FIG. 14b shows the arrangement of the virtual illumination-predetermining facets 25 in accordance with the arrangement of the sub-pupil regions 30 as this is based on an arrangement for the illumination optical unit 11 with the illumination-predetermining facet mirror 7 arranged in the illumination pupil. The illumination-predetermining facets 25 are rotated by 45° in relation to a Cartesian xy-grid.

FIG. 14a shows the effect emerging after the anamorphic imaging onto the arrangement of the sub-pupil regions 30 in the exit pupil of the projection optical unit 10. The Cartesian-rotated arrangement of the round sub-pupil regions 30 in the illumination pupil becomes an approximately hexagonal arrangement of elliptical sub-pupil regions 30 in the exit pupil.

Figure 16:
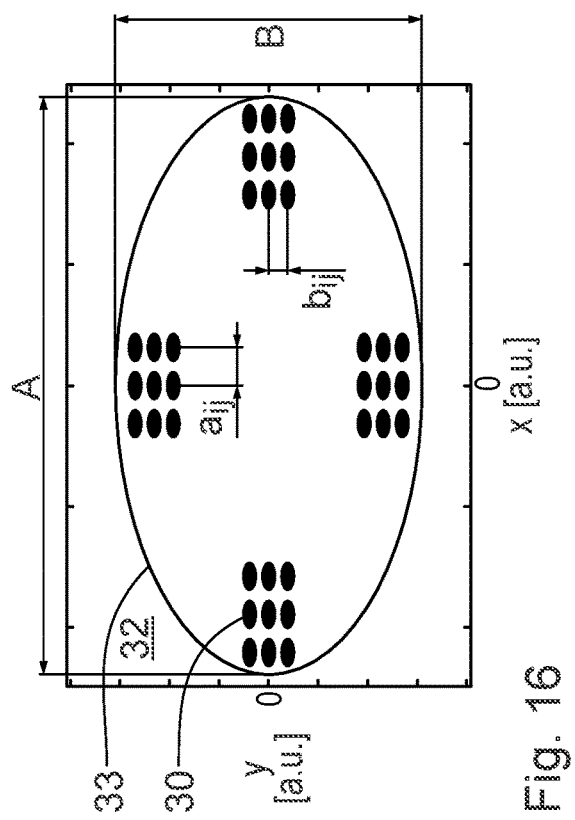
FIGS. 15 and 16 show sub-pupil arrangements, corresponding to FIGS. 3 and 4, for a further illumination setting of the projection exposure apparatus, wherein an alternative packing of the sub-pupil regions is depicted, wherein, unlike in FIGS. 3 to 14, the sub-pupil regions deviate from a circular form, i.e. they are not rotationally symmetric, in the illumination pupil of the illumination optical unit and they are circular in the exit pupil of the projection optical unit, i.e. they are rotationally symmetric there.
Figure 15:
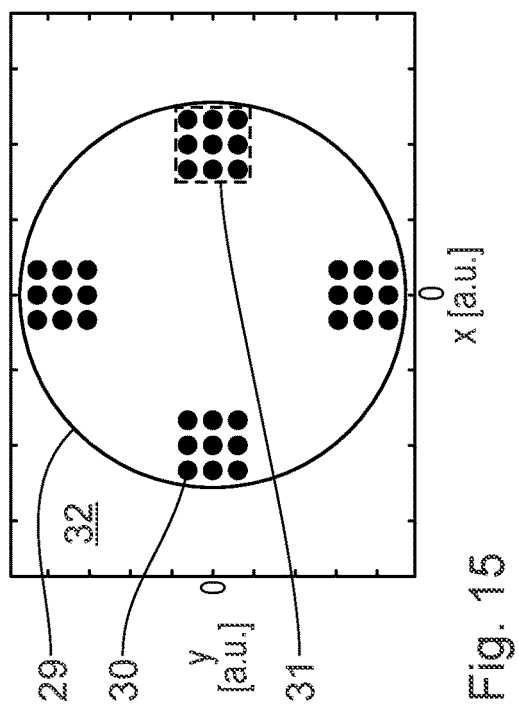

FIGS. 15 and 16 show an arrangement of the sub-pupil regions 30, otherwise corresponding to FIGS. 13 and 14, with the difference that the sub-pupil regions 30 in the illumination pupil (cf. FIG. 16) respectively have a form deviating from the circular form, namely having a maximum extent in a first sub-pupil dimension—the x-direction in FIG. 16—and a minimum extent in a second sub-pupil dimension—the y-direction in FIG. 16.

The sub-pupil regions 30 are elliptical with an axis ratio of 2, wherein the major axis of the ellipse extends parallel to the x-direction and the minor axis extends parallel to the y-direction. The elliptical sub-pupil regions 30 in the illumination pupil according to FIG. 16 emerge, for example, as images of a corresponding elliptical light source 2. The orientation of the sub-pupil regions 30 that are elliptical in the illumination pupil is selected in such a way that round sub-pupil regions 30 emerge in the exit pupil of the projection optical unit 10 as a result of the anamorphic effect of the projection optical unit 10.

Alternatively, sub-pupil regions which are elliptical in the manner of FIG. 16 can also emerge via anamorphic imaging of an e.g. rotationally symmetric light source 2.

Figure 17:
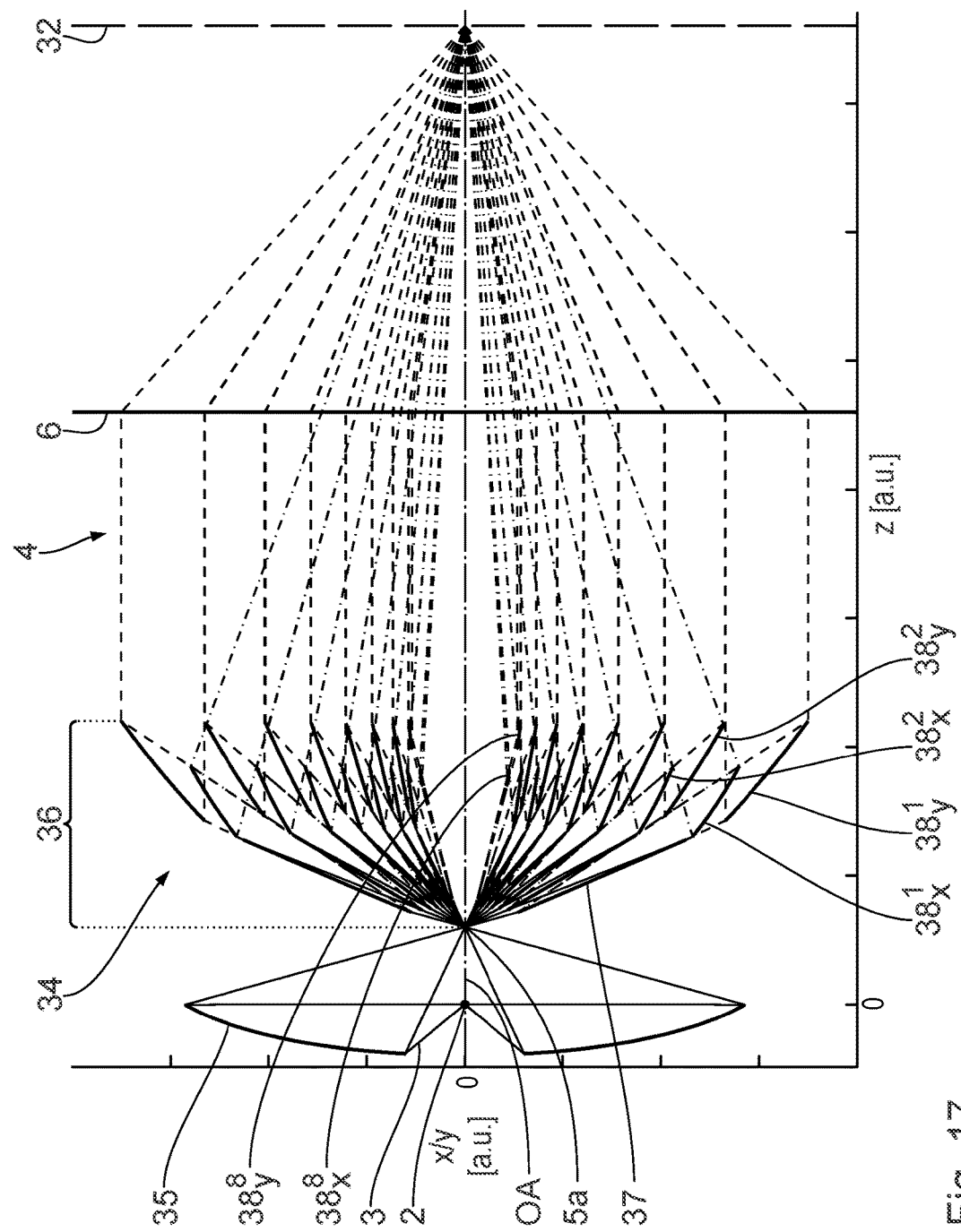
FIG. 17 shows an embodiment of a collector as part of a transmission optical unit for guiding the illumination light via a first facet mirror to an illumination-predetermining facet mirror of the illumination optical unit.

FIG. 17 shows an example for a collector 34, which can be used in place of the collector 5 according to FIG. 1 and, together with the first facet mirror 6, forms the transmission optical unit 4 for guiding the illumination light to the pupil plane 32. Components which correspond to those already explained above in relation to FIGS. 1 to 16, and in particular in relation to FIGS. 1 and 2, are denoted by the same reference signs and are not discussed again in detail.

The transmission optical unit 4 including the collector 34 has an anamorphic effect such that elliptical sub-pupil regions 30 in the style of FIG. 16 are generated in the illumination pupil in the pupil plane 32. The first facet mirror 6 is depicted schematically in transmission in FIG. 17. It is clear that the optical effect of the first facet mirror 6 is achieved correspondingly in reflection.

The collector 34 includes a first ellipsoid mirror 35 in the beam path of the illumination light 3, which ellipsoid mirror is rotationally symmetric in relation to a central optical axis OA of the collector 34.

The ellipsoid mirror 35 transfers the used light emission from the source 2 to the intermediate focus 5a. Consequently, the ellipsoid mirror 35 is a first collector subunit which generates a secondary intermediate image of the light source 2 in the beam path of the illumination light 3. In the embodiment according to FIG. 17, the intermediate image 5a has the symmetry of the light source 2. To the extent that the light source 2 is rotationally symmetric, this also applies to the intermediate image 5a.

In the beam path of the illumination light 3, the ellipsoid mirror 35 is followed by another collector subunit 36, which is embodied as nested collector and, in terms of its function, in any case in terms of its main planes, corresponds to a Wolter collector. FIG. 17 depicts, using dashed lines, a beam path in the yz-section, i.e. in the plane corresponding to the meridional section according to FIG. 1. The beam path of the illumination light 3 in the xz-section perpendicular thereto is shown in FIG. 17 using dash-dotted lines.

The collector subunit 36 is subdivided into hyperbolic shells 37 with a reflection surface profile rotationally symmetric in relation to the optical axis OA and into elliptical shells 38.

These elliptical shells are respectively depicted in the yz-section (cf. shell section $38_y$ in FIG. 17) and in the xz-section (cf. shell section $38_x$ in FIG. 17). Thus, a yz-section would only cut the shell sections $38_y$ and an xz-section would only cut the shell sections $38_x$. The respective elliptical shells 38, which are linked to one another in their continuous extent about the optical axis, are provided with the same superscript index, e.g. the index "1", in FIG. 17. The shell sections $38_x^1$ and $38_y^1$ are conical sections with different radii of curvature and different conical constants, which continuously merge into one another along the circumferential direction about the optical axis. In this way, a total of eight elliptical shells 38, arranged nested in one another, of the collector subunit 36 emerge.

A deflecting reflecting effect, i.e., abstractly, a refractive power, of the elliptical shells $38_x^i$ is greater than the deflecting reflecting effect of the respectively associated shell $38_y^i$. What emerges are the beam paths of the illumination light 3 between the collector subunit 36 and the first facet mirror 6, as depicted in FIG. 17, wherein the rays of the illumination light 3 reflected by the elliptical shells $38_x$ propagate convergently to one another and the rays of the illumination light 3 reflected by the elliptical shells $38_y$ propagate parallel to one another.

In the yz-plane, the transmission facets 21 of the first facet mirror 6 have an imaging effect and, together with the elliptical shells $38_y$, generate a further image of the light source 2 in the yz-plane. This image is generated in the pupil plane 32. Then, a sub-pupil range 30 is generated in the pupil plane 32 for each illuminating channel or illumination channel. In the xz-plane, the transmission facets of the first facet mirror 6 do not have an imaging effect, and so the illumination light 3 is reflected in the xz-plane by the transmission facets 21 as it would be by a plane mirror; in the schematic transmission illustration according to FIG. 17, this does not lead to a change in direction of the dash-dotted rays, propagating in the xz-direction, of the illumination light 3. Consequently, it remains in the case of the imaging effect of the elliptical shells $38_x$, which likewise image the intermediate image 5a in the pupil plane 32.

Overall, the transmission facets 21 of the first facet mirror 6 of the arrangement according to FIG. 17 are embodied as cylindrical mirrors which have a concave curvature in the yz-plane. Since the first facet mirror 6 is illuminated over an illumination region, the y-extent of which is greater than the x-extent thereof, images of the light source are generated in the pupil plane 32, that is to say sub-pupil regions, the y-extent of which is smaller than the x-extent thereof, as depicted in, for example, FIG. 16.

Figure 18:
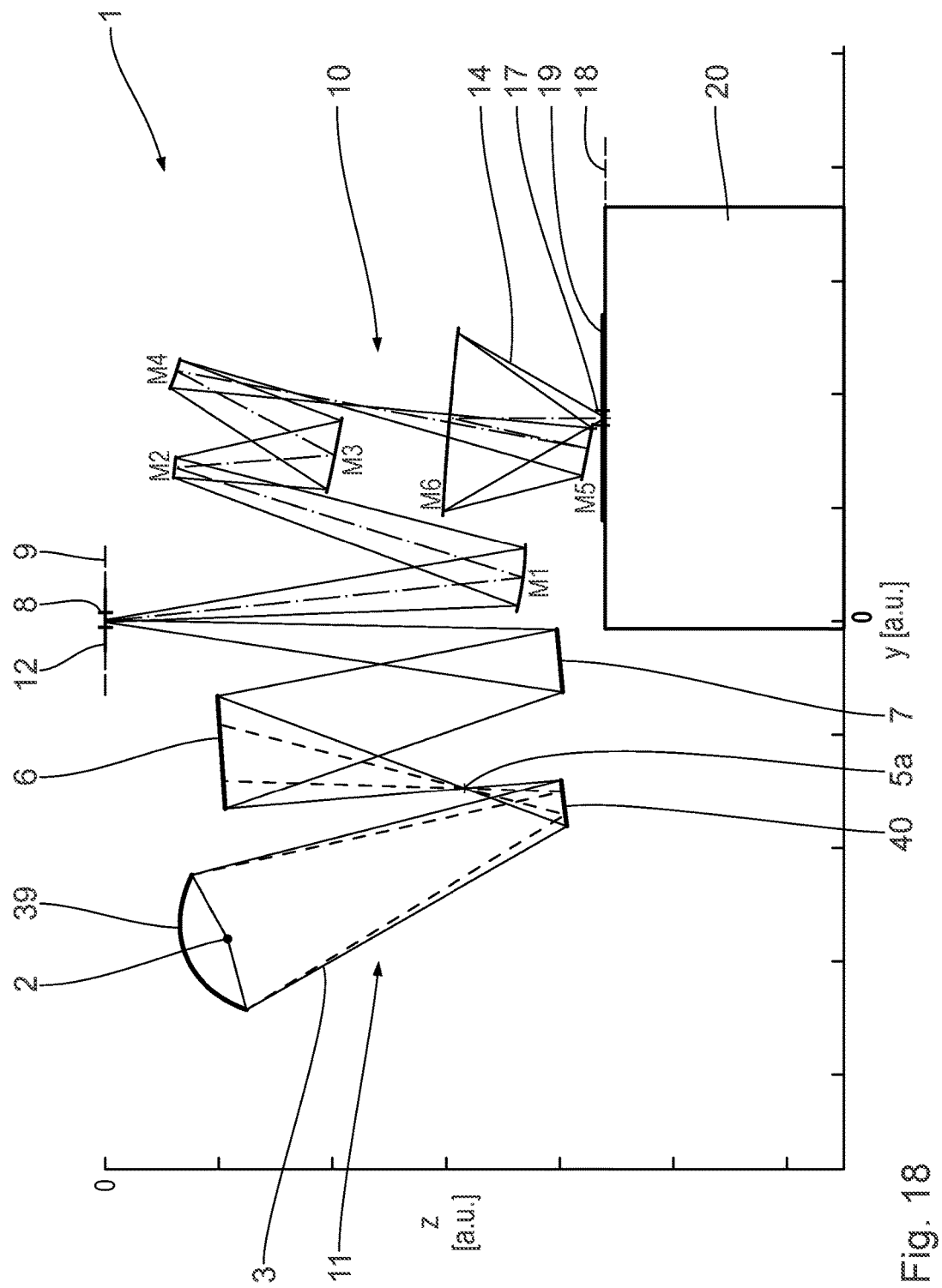
FIG. 18 shows, in an illustration similar to FIG. 1, a further embodiment of a projection exposure apparatus for EUV microlithography, including an illumination optical unit and a projection optical unit including a first transmission optical unit for generating an elliptical intermediate image of the light source upstream of a first facet mirror of the illumination optical unit.

FIG. 18 shows a further embodiment of the projection exposure apparatus 1. In place of the projection optical unit 10, which is depicted in the meridional section with six mirrors M1 to M6 therein, use can be made of an embodiment of an anamorphic projection optical unit, as is described in e.g. US 2013/0128251 A1.

In the beam path downstream of the light source 2, the illumination optical unit 11 of the projection exposure apparatus 1 according to FIG. 18 includes a collector 39 and a downstream transmission mirror 40, which both form an anamorphic optical unit, which generate an elliptical intermediate image in the intermediate focus 5a from the source 2 which is rotationally symmetric in this embodiment. Here, the beam path from the collector 39 to the first facet mirror 6 in the yz-plane is depicted by a full line and the beam path from the collector 39 to the first facet mirror 6 in the xz-plane is depicted by a dashed line.

The optical effect of the transmission-optical components 39, 40 is such that the intermediate image in the intermediate focus 5a is not rotationally symmetric and has a greater extent in the x-direction than in the y-direction. The intermediate image in the intermediate focus 5a can be elliptical. Then, an illumination pupil with sub-pupil regions 30 with an x/y-aspect ratio corresponding to this intermediate image is generated by way of the first facet mirror 6 and the illumination-predetermining facet mirror 7. This can also be used to generate an arrangement of the sub-pupil regions 30 in the illumination pupil in accordance with the arrangement according to e.g. FIG. 16. In the illumination optical unit 11 according to FIG. 18, the transmission facets 21 of the first facet mirror 6 do not require a rotationally asymmetrical refractive power or any refractive power substantially deviating from rotational symmetry. Since the transmission facets 21 of the first facet mirror 6 are not impinged perpendicularly by the illumination light 3, it may be advantageous to embody these facets 21 in a toric or elliptical manner.

In the exemplary embodiment according to FIG. 18, the transmission mirror 40 is depicted as an NI mirror, i.e. as a mirror which is impinged by the illumination light 3 with angles of incidence between 0° and 30°. Alternatively, the transmission mirror 40 can also be embodied as a grazing incidence mirror (GI mirror), i.e. as a mirror which is impinged by the illumination light 3 with angles of incidence in the range between 60° and 90°.

Conversely, the mirror of the collector subunit 36 described above in the context of FIG. 17, in particular the elliptical shells 38, can be embodied as an NI mirror.

The illumination optical unit 11 according to FIG. 18 includes a total of three NI mirror components downstream of the collector 39, namely the transmission mirror 40, the first facet mirror 6 and the illumination-predetermining facet mirror 7. What this involves is, unlike the illumination optical units explained above, the light source 2 in the illumination optical unit 11 according to FIG. 18 is arranged on the same side of the image plane 18 as the projection optical unit 10.

Below, a further embodiment of an illumination optical unit 11 for the projection exposure apparatus 1 is described on the basis of FIGS. 19 and 20. Components which correspond to those already explained above in relation to FIGS. 1 to 18, and in particular in relation to FIG. 18, are denoted by the same reference signs and are not discussed again in detail.

Figure 20:
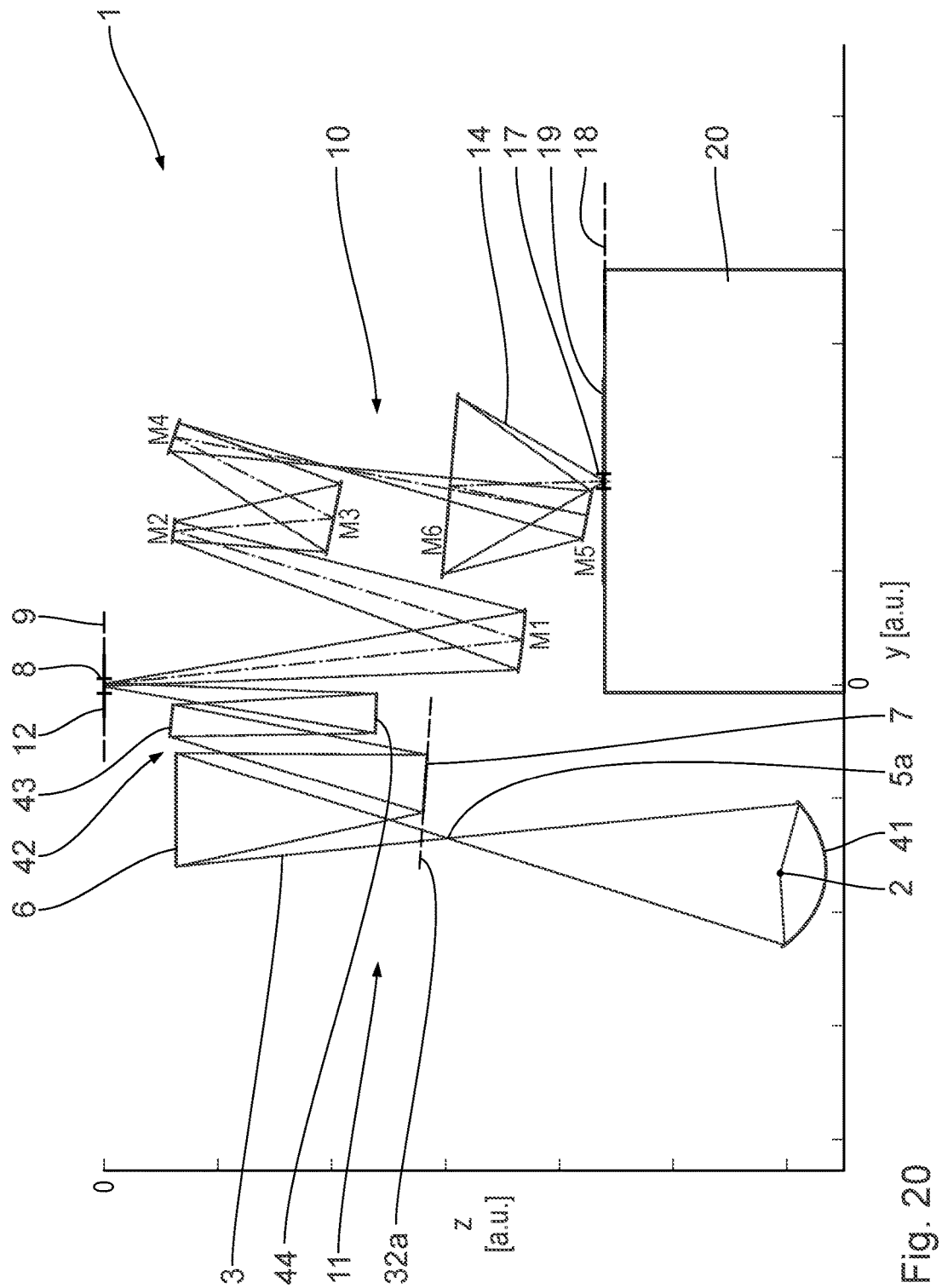
FIG. 20 shows, in an illustration similar to FIG. 18, a projection exposure apparatus including a further embodiment of the illumination optical unit including a further transmission optical unit, disposed downstream of an illumination-predetermining facet mirror, for generating an illumination pupil of the illumination optical unit, which predetermines an illumination angle distribution in the object field and has an envelope deviating from a circular form, wherein the further transmission optical unit is embodied as a telescopic optical unit with a rotationally symmetric imaging effect.

Proceeding from the light source 2, the illumination optical unit 11 according to FIG. 20 includes a rotationally symmetric collector 41, the function of which corresponds to that of the collector 5 in the embodiment according to FIG. 1, and, downstream thereof, the first facet mirror 6 and the illumination-predetermining facet mirror 7. The image of the light source 2 in the intermediate focus 5a is rotationally symmetric. Using the transmission facet mirror 6 and the illumination-predetermining facet mirror 7, an illumination pupil with an envelope deviating from the circular form in accordance with the embodiments explained above is generated. In the illumination optical unit 11 according to FIG. 20, the illumination-predetermining facet mirror 7 is arranged in a pupil plane conjugate to the pupil plane 32. The extent of the illumination-predetermining facet mirror 7, which then acts as a pupil facet mirror, is twice as large in the x-direction as it is in the y-direction.

A further transmission optical unit 42 with two transmission mirrors 43, 44 is arranged between the illumination-predetermining facet mirror 7 and the object field 8. The transmission optical unit 42 firstly images the transmission facet groups of the transmission facet mirror 6 on the object field 8 together with the illumination-predetermining facet mirror 7 and secondly images the pupil plane 32a on the entry pupil of the projection optical unit 10, which is arranged in the pupil plane 32. This pupil plane 32 can be disposed upstream of the object field 8, that is to say between the second transmission mirror 44 and the object field 8, in the beam path of the illumination light 3 or downstream of the object field 8 in the beam path of the imaging light, which was reflected by the reticle 12. Both variants are indicated schematically in FIG. 20. Thus, the transmission optical unit 42 images the pupil plane 32a on the entry pupil plane 32 of the projection optical unit 10, in which one of the illumination pupils then is generated as a superposition of sub-pupil regions 30, as already explained above in the discussion relating to the various arrangement variants of the sub-pupil regions 30.

Figure 19:
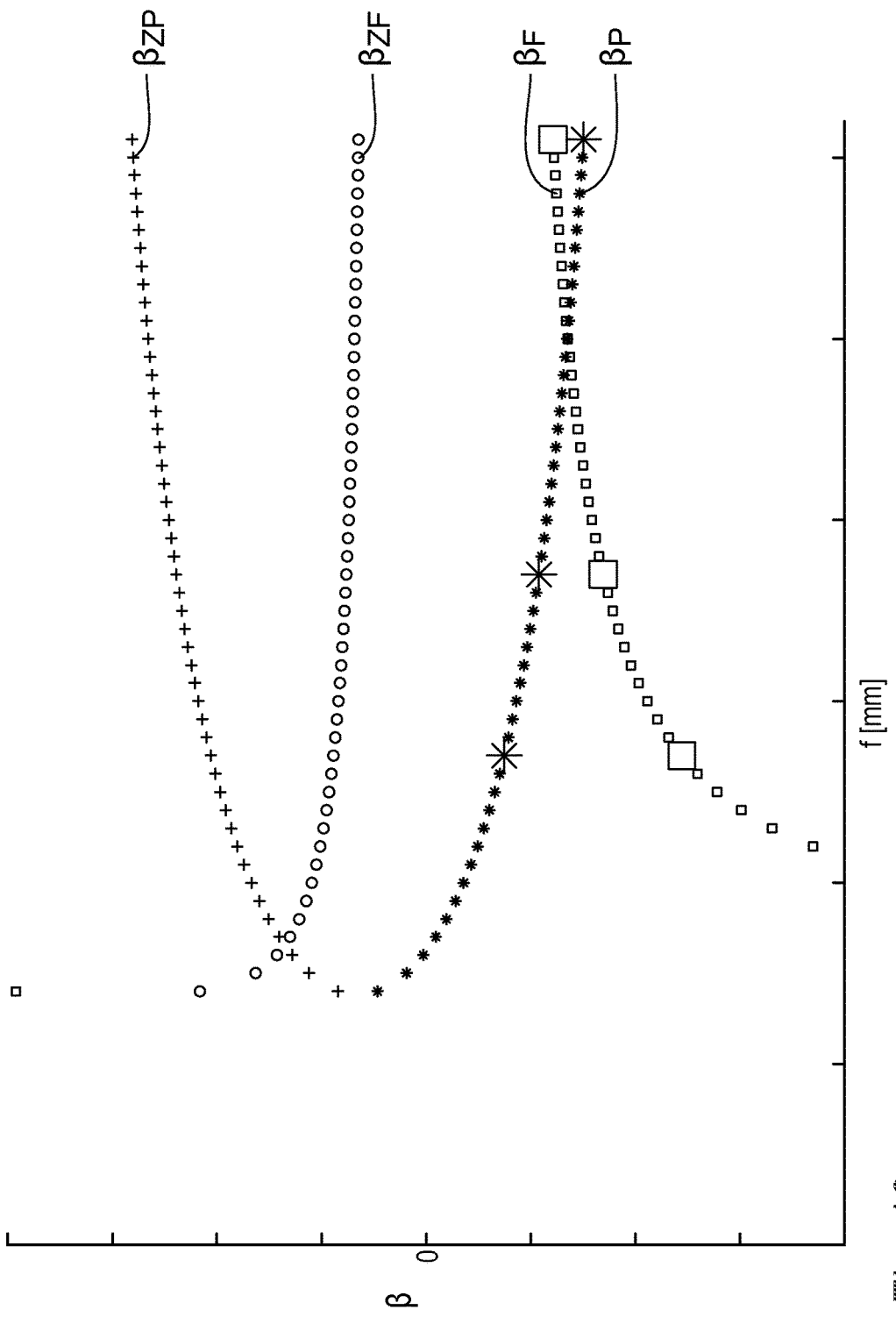
FIG. 19 shows, in a diagram, a dependency of imaging scales of, firstly, pupil imaging and, secondly, of field imaging by the illumination optical unit on a focal length of pupil facets of a pupil facet mirror of one embodiment of the illumination optical unit.

Certain pairs of imaging scales, which are elucidated in the diagram of FIG. 19, can be realized for this combined field and pupil imaging, in which the transmission optical unit 42 is involved. What is plotted in each case is the imaging scale β as a function of a focal length f of the pupil facets of the pupil facet mirror 7. The two upper branches βZP and βZF denote the dependence of the imaging scale of the pupil imaging (βZP) and the field imaging (βZF) in the case where the transmission optical unit 42 generates an intermediate image. The two lower branches βP and βF denote the case, which is discussed in more detail below and realized in the projection optical unit 11 according to FIG. 20, in which the transmission optical unit 42 does not generate an intermediate image. Here, βP denotes the imaging scale of the pupil imaging and βF denotes the imaging scale of the field imaging.

The illumination optical unit 11 according to FIG. 20 is dimensioned in such a way that, in combination with a focal length of the pupil facets in the region of 770 mm, an imaging scale βP of −1 for the pupil imaging and of approximately −1.75 for the field imaging is realized. The first transmission mirror 43 has a focal length of approximately −1100 mm and the second transmission mirror 44 has, in absolute terms, a slightly smaller focal length of approximately 1000 mm. A used region of the pupil facet mirror 7, on which the illumination light 3 impinges, has an extent of approximately 500 mm in the x-direction and an extent of approximately 250 mm in the y-direction.

Figure 21:
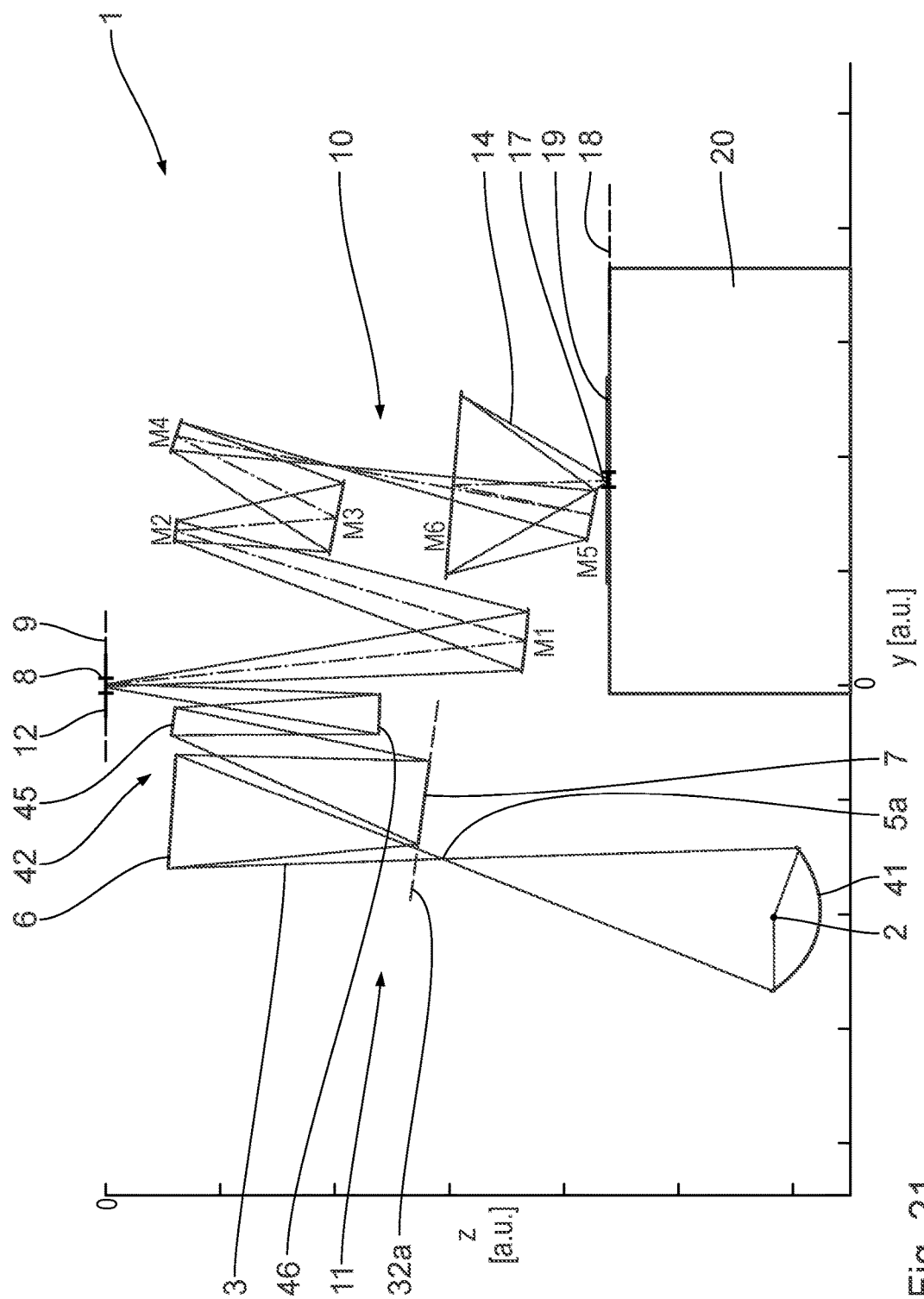
FIGS. 21 and 22 show, in an illustration similar to FIG. 20, a projection exposure apparatus including further embodiments of illumination optical units, wherein the further transmission optical unit is embodied as an anamorphic optical unit.

FIG. 21 shows a further embodiment of the illumination optical unit 11, for use in the projection exposure apparatus 1. Components and structure elements and also functions which correspond to those already explained above in relation to FIGS. 1 to 20 are appropriately denoted by the same reference signs and are not discussed again in detail.

In the illumination optical unit 11 according to FIG. 21, the illumination-predetermining facet mirror 7, which in turn is embodied as a pupil facet mirror 7, is round, i.e. it has an xy-aspect ratio of 1. The transmission optical unit 42 downstream of the pupil facet mirror 7 is embodied as an anamorphic optical unit and generates the illumination pupil of the illumination optical unit 11 with an envelope 33 deviating from the circular form from the pupil still present with a rotationally symmetric envelope in the pupil plane 32a, as already explained above in the context of the various sub-pupil region arrangements.

The anamorphic transmission optical unit 42 according to FIG. 21 is in turn embodied with two transmission mirrors which, in the sequence of the impingement thereof by the illumination light 3, are denoted by the reference numerals 45 and 46. Together with the focal lengths of the pupil facets of the pupil facet mirror 7 of approximately 1010 mm and 670 mm, this transmission optical unit 42 generates imaging scales βF of approximately −1.2 in the xy-plane and 2.4 in the yz-plane. Simultaneously, the transmission optical unit 42 images the round pupil facet mirror in the xz-plane and in the yz-plane with the imaging scales of −1.5 and −0.75 respectively, and thus provides the desired elliptical entry pupil.

The focal lengths f of the transmission mirrors 45, 46 are −12.6 m and 1214 mm in the xz-plane and −461 mm and 889 mm in the yz-plane.

In the illumination optical unit 11 according to FIG. 21, an impinged-upon region on the pupil facet mirror 7 has an overall radius of 184 mm. The diameter of the impinged-upon region on the pupil facet mirror 7 is therefore significantly smaller than the maximum extent of the impinged-upon region in the pupil facet mirror 7 according to FIG. 20. This results in smaller switching angles for the transmission facets 21. This simplifies the technological implementation of these facets 21.

The transmission facet groups, into which the transmission facets 21 are grouped, or the monolithic facets corresponding to these facet groups have an extent of 100 mm in the x-direction and 3 mm in the y-direction in the illumination optical unit 11 according to FIG. 21.

Figure 22:
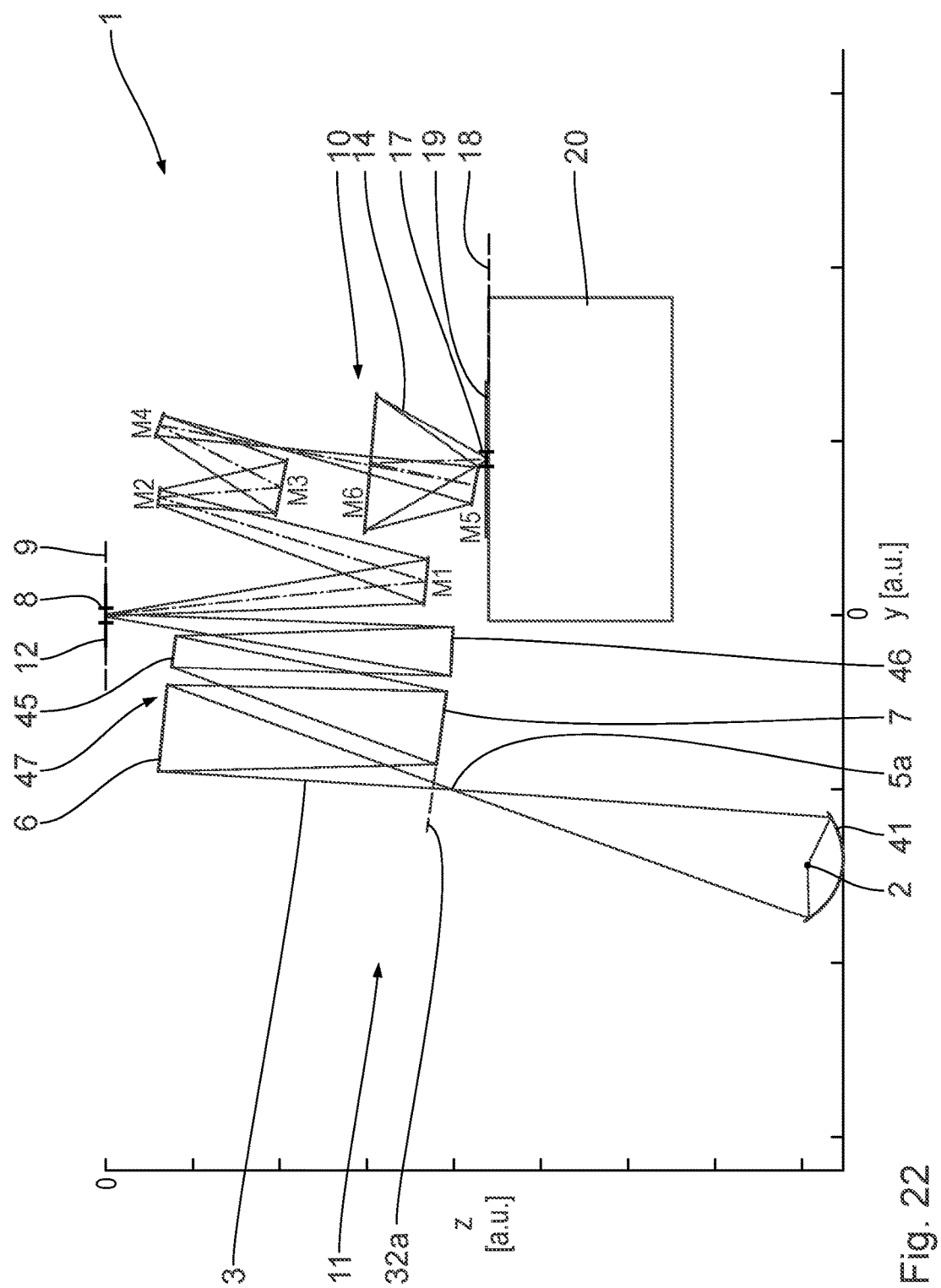

FIG. 22 shows a further embodiment of the illumination optical unit 11, which otherwise corresponds to FIG. 21, including a different design of a transmission optical unit 47, which otherwise corresponds to the transmission optical unit 42 according to FIG. 21. The transmission mirrors 45, 46 of the transmission optical unit 47 are matched to the focal lengths of the pupil facets of the pupil facet mirror 7 of approximately 2010 mm and 1020 mm, respectively, and once again image field and pupil without intermediate image. This results in imaging scales PP for the pupil imaging of −1.3 and −0.65, respectively, and imaging scales βF for the field imaging of −1.0 and −2.0, respectively.

The pupil facet mirror 7 is also round in the illumination optical unit 11 according to FIG. 22, wherein the impinged-upon region of the pupil facet mirror 7 has a radius of 211 mm.

The transmission facet groups which are formed by grouping the transmission facets 21 or the monolithic field facets corresponding to these have a dimension of 120 mm in the x-direction and of slightly less than 4 mm in the y-direction.

A transmission optical unit disposed downstream of the illumination-predetermining facet mirror 7 can also be used to reduce switching angles for the transmission facets 21, particularly if the illumination-predetermining facet mirror is not arranged in a pupil plane, i.e. if it is embodied as a specular reflector.

Figure 23A:
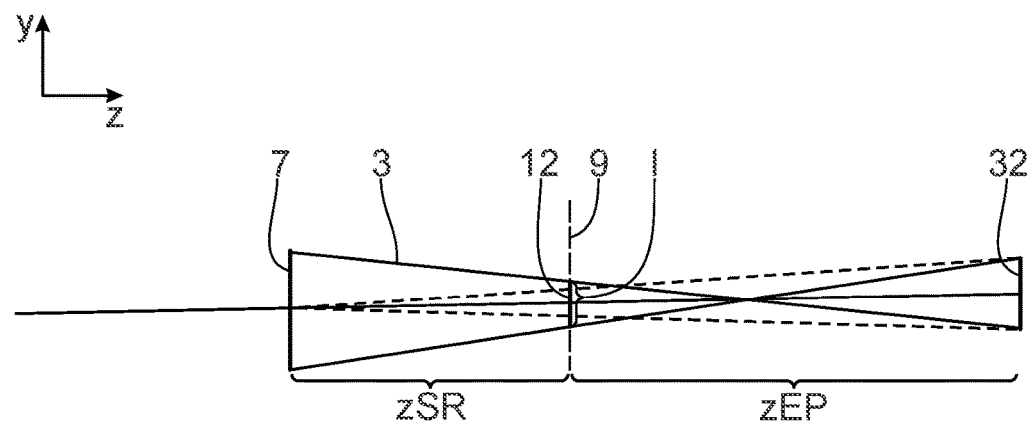
FIG. 23a shows a longitudinal section (yz-section) containing an object displacement direction through a portion of the illumination optical unit between a portion of the illumination-predetermining facet mirror and an illumination pupil which is disposed in the beam path downstream of a reticle to be illuminated.

FIG. 23a shows a yz-section through a portion of the illumination optical unit 11 between the illumination-predetermining facet mirror 7 and a pupil plane 32, disposed downstream of the reticle 12 in this case in the beam path of the illumination light 3, in which the illumination pupil is generated.

Figure 23B:
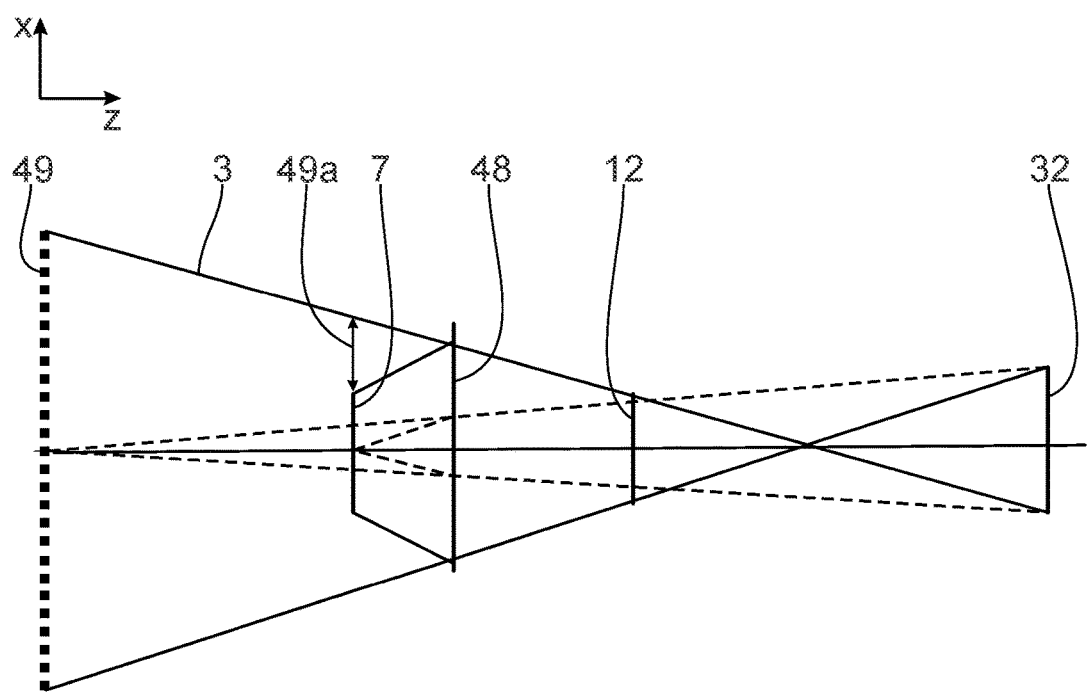
FIG. 23b shows a corresponding longitudinal section (xz-section) formed perpendicular thereto.

FIG. 23b shows a corresponding xz-section.

What is depicted is a construction of the beam path of the illumination light 3, once again in a schematic transmission lens section comparable to FIG. 17 explained above.

An extent of the sub-pupil ranges 30 within the illumination pupil emerges from the following relationship:

$$\Delta k = 1(1/zEP - 1/zSR)$$

Δk is a measure for the variation of the illumination angle and therefore a measure for the extent of the respective sub-pupil region 30 belonging to the respectively considered illumination channel. Here, l denotes the extent of the object field 8 in the respectively considered dimension x or y. zEP describes a distance between the illumination pupil and the object plane 9 in the z-direction, i.e. along the beam path of the illumination light 3. This distance in the yz-plane may differ from that in the xz-plane. zSR describes the distance of the illumination-predetermining facet mirror 7 from the object plane 9 in the z-direction.

If the above equation is considered in the yz-plane, i.e. in the plane containing the object displacement direction y, l represents the scanning length (object field dimension in the scanning direction). Then Δk quantifies a length of the sub-pupil regions 30, which emerges in an integrated manner during the scanning process in the y-direction. As a result of the scanning process, the respective sub-pupil range 30 is therefore deformed in a rod-shaped manner along the scanning direction, which is why the sub-pupil regions 30 are also referred to as rods.

What can be achieved in the case of the anamorphic projection optical unit 10 in a scan-integrated manner is that the illumination pupil is completely filled by the sub-pupil regions 30, either overall or within the predetermined illumination poles (cf. poles 31, e.g. in FIG. 4), that is to say that, in a scan-integrated manner, a point on the reticle 12 is impinged with illumination light from every illumination direction within the illumination pupil or within the predetermined poles. A homogeneously completely filled pupil can be obtained in a scan-integrated manner within predetermined tolerances via appropriate matching of the distance conditions for zSR and zEP with the scanning geometry of the projection exposure apparatus.

A cylindrical mirror 48, which represents a transmission optical unit disposed downstream of the illumination-predetermining facet mirror 7, is arranged between the illumination-predetermining facet mirror 7 and the reticle 8. The cylindrical mirror 48 only has an imaging effect in the xz-plane, as a result of which, as depicted in FIG. 23b, this results in a virtual enlargement of the illumination-predetermining facet mirror 7. A virtual, magnified image of the illumination-predetermining facet mirror 7 is shown in FIG. 23b at 49. Thus, as a result of the cylindrical mirror 48, there is a size reduction of the illumination-predetermining facet mirror 7 in respect of its x-extent, as indicated in FIG. 23b via a double-headed arrow 49. As a result, the switching angles of the transmission facets 21 are reduced. Once again, elliptical sub-pupil regions 30 emerge in the illumination pupil plane due to the different imaging effects of the illumination optical unit according to FIG. 23 in, firstly, the yz-plane and, secondly, in the xz-plane. These are then converted into round sub-pupil regions 30 in the exit pupil of the projection optical unit 10, as already explained above for example in the context of FIGS. 15 and 16.

The pupil plane 32 need not have the same z-coordinate in the xz-plane as in the yz-plane. This is also indicated in FIG. 23, where a distance between the reticle 12 and the pupil plane 32 is greater in FIG. 23a than in FIG. 23b.

As an alternative to the reduction in the tilt angle properties of the transmission facets 21 described in FIG. 23, an aspect ratio of the illumination-predetermining facet mirror 7 involving larger switching angles of the facets 21 can be accounted for by transmission facets 21 that include two tilt axes which are designed for differently large switching angles and accuracies. By way of example, these anisotropic tilt angle characteristics can be realized by spring hinges with different stiffness, positioning motors with different positioning forces or anisotropic damping.

Figure 24:
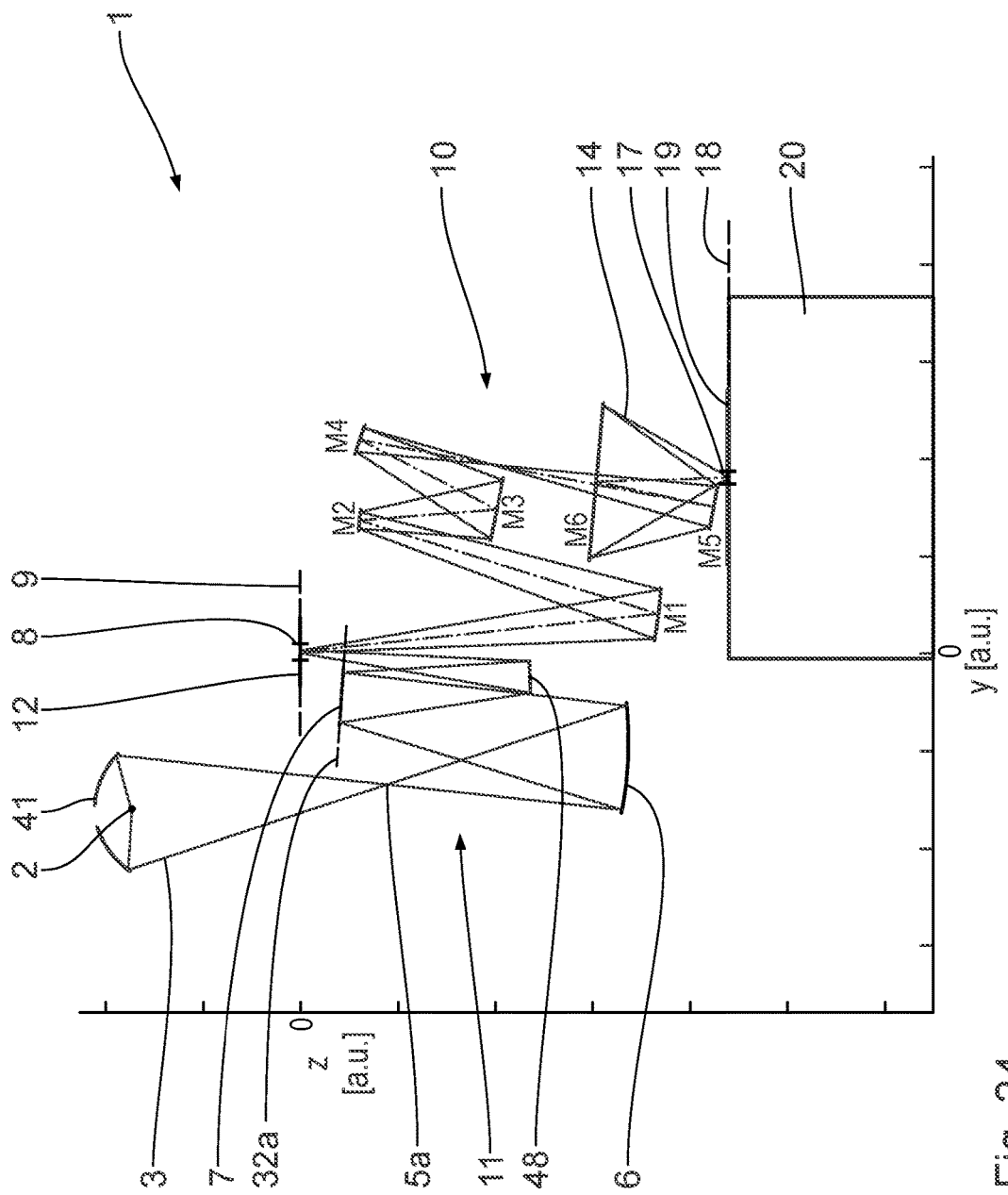
FIG. 24 shows, in an illustration similar to FIG. 18, a projection exposure apparatus including a further embodiment of an illumination optical unit with an optical effect in accordance with FIG. 23.

FIG. 24 shows a variant of the projection exposure apparatus 1 including an exemplary embodiment of the projection optical unit 11 including such a cylindrical mirror 48. Proceeding from the collector 41, the projection optical unit 11 according to FIG. 24 once again includes an odd number of reflecting components, namely the transmission facet mirror 6, the illumination-predetermining facet mirror 7 and the cylindrical mirror 48. Therefore, in a manner comparable to the illumination optical unit according to FIG. 18, the light source is also arranged on the same side of the image plane 18 as the projection optical unit 10 in the illumination optical unit according to FIG. 24.

FIGS. 25 to 36 show further variants of illuminations of, firstly, the illumination pupil of the illumination optical unit 11 and, secondly, of the exit pupil of the projection optical unit 10, respectively for an illumination setting with a pupil that is filled as completely as possible. The illustrations in FIGS. 25 to 36 in principle correspond to the pupil illustrations of FIGS. 3 to 16.

Figure 25:
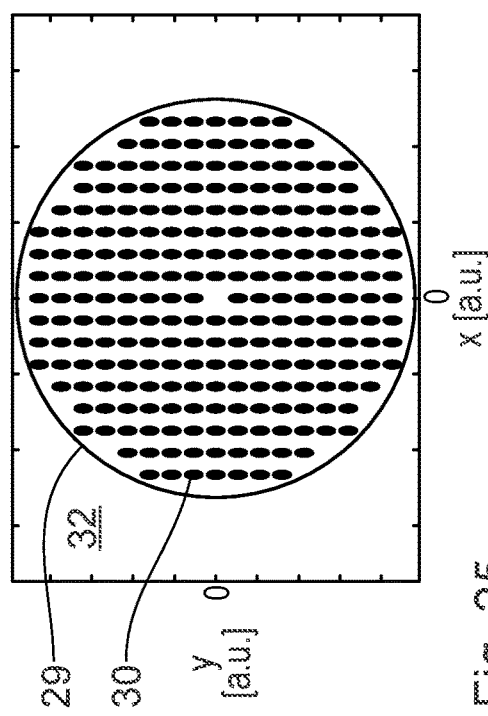

FIG. 25 shows an embodiment with elliptical sub-pupil regions 30 in the exit pupil of the projection optical unit 10 having a circular envelope 29. The sub-pupil regions 30 are elliptical with an x/y-aspect ratio of approximately ½. The associated illumination pupil (cf. FIG. 26) has an envelope 33 with an x/y-aspect ratio of 2 and round sub-pupil regions 30. The region impinged overall in the illumination pupil is elliptical.

In the exit pupil (FIG. 25), a raster arrangement of the sub-pupil regions 30 is present with the same grid constant in the x- and y-direction.

Figure 26:
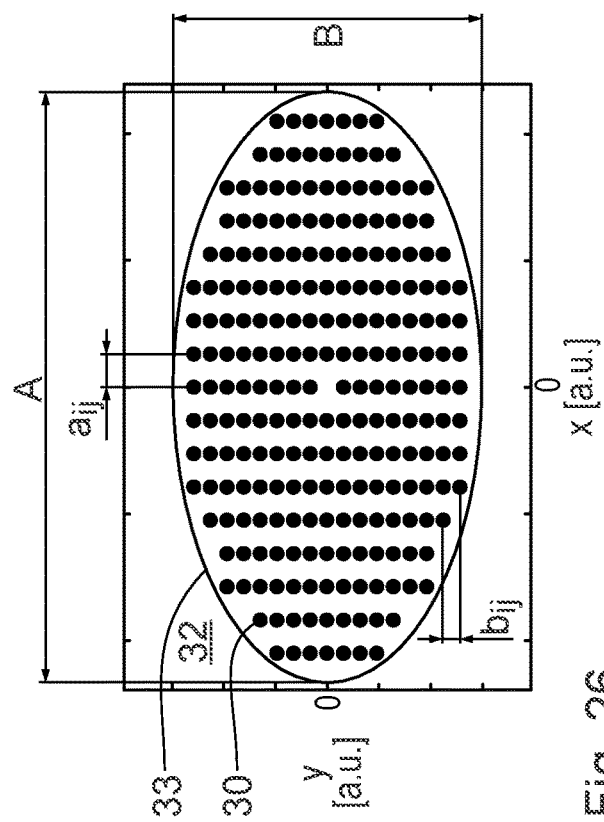
FIGS. 25 and 26 show, in an illustration similar to FIGS. 3 and 4, an arrangement of illumination sub-pupils of a further illumination setting (maximum pupil filling) with elliptical sub-pupil regions in the exit pupil of the projection optical unit and round sub-pupil regions in the illumination pupil of the illumination optical unit.
Figure 27:
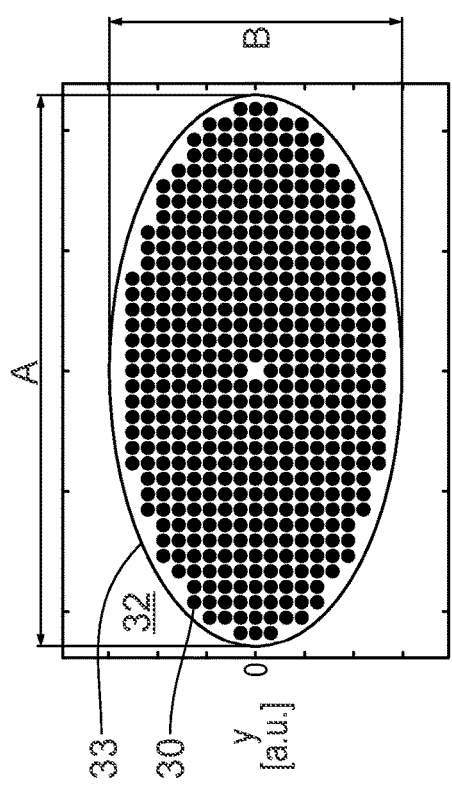
FIGS. 27 and 28 show, in an illustration similar to FIGS. 25 and 26, a further packing arrangement of sub-pupil regions with elliptical sub-pupil regions in the exit pupil of the projection optical unit and round sub-pupil regions in the illumination pupil of the illumination optical unit.
Figure 28:
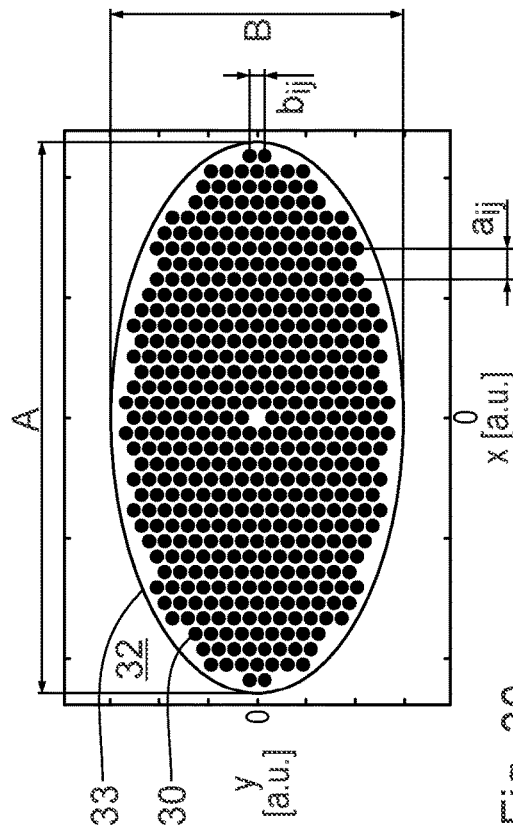

FIGS. 27 and 28 correspond to FIGS. 25 and 26 with the difference that a packing density of the sub-pupil regions 30, firstly in the exit pupil of the projection optical unit 10 and secondly in an illumination pupil of the illumination optical unit 11, is increased.

Figure 29:
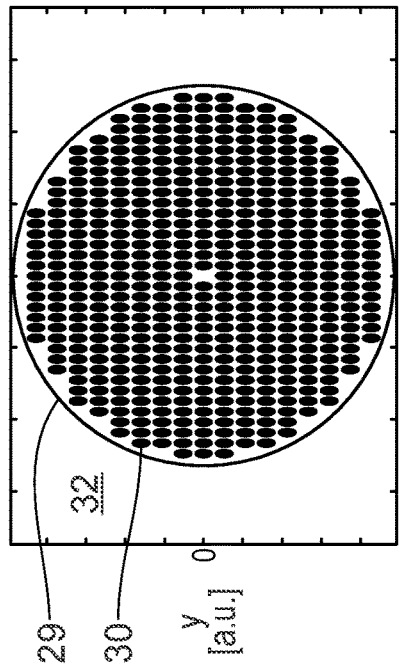
FIGS. 29 and 30 show, in an illustration similar to FIGS. 7 and 28, a further raster arrangement of the sub-pupil regions.
Figure 30:
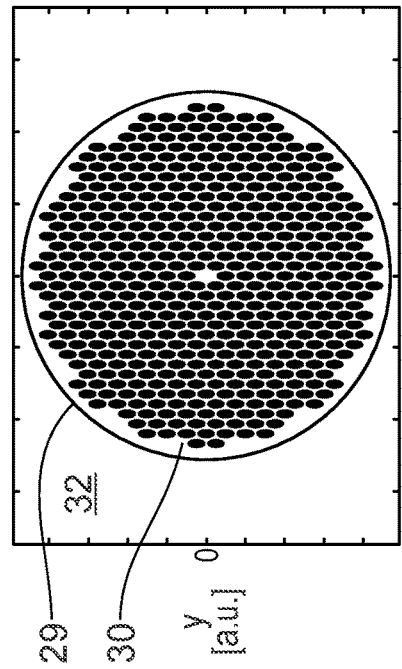

FIGS. 29 and 30 show an arrangement of the sub-pupil regions 30, wherein, in turn, the sub-pupil regions 30 of one of the columns of the raster arrangement are arranged offset from one another relative to the sub-pupil regions of an adjacent column of the raster arrangement by half a spacing of sub-pupil regions 30 adjacent to one another within a column. Additionally, the sub-pupil regions 30 of adjacent lines overlap since the spacing between adjacent lines is smaller than the y-extent of the sub-pupil regions 30. This results in reduced breaking of the symmetry of the arrangement of the illumination sub-pupils in the exit pupil of the lens and, as result thereof, in a smaller directional dependence of the imaging properties of the projection exposure apparatus (cf. FIG. 29).

Figure 31:
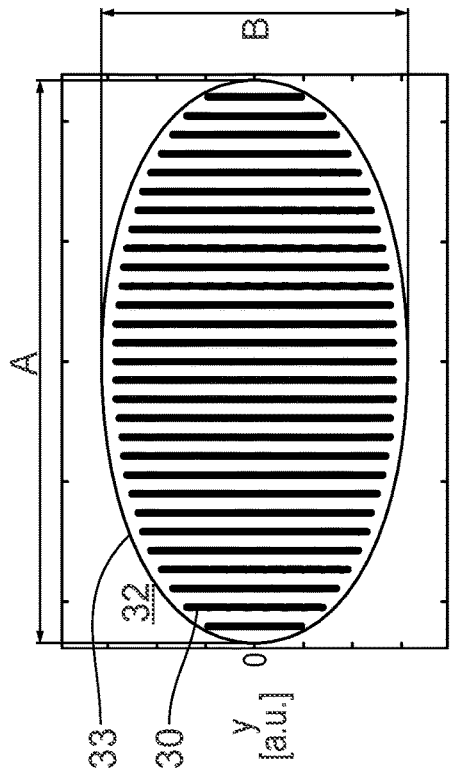
FIGS. 31 and 32 show, in an illustration similar to FIGS. 29 and 30, a further arrangement of the sub-pupil regions, wherein, unlike in the arrangements according to FIGS. 25 to 29, an illumination optical unit includes an illumination-predetermining facet mirror which is not arranged in a pupil plane of the illumination optical unit in order to generate the arrangement according to FIGS. 31 and 32.
Figure 32:
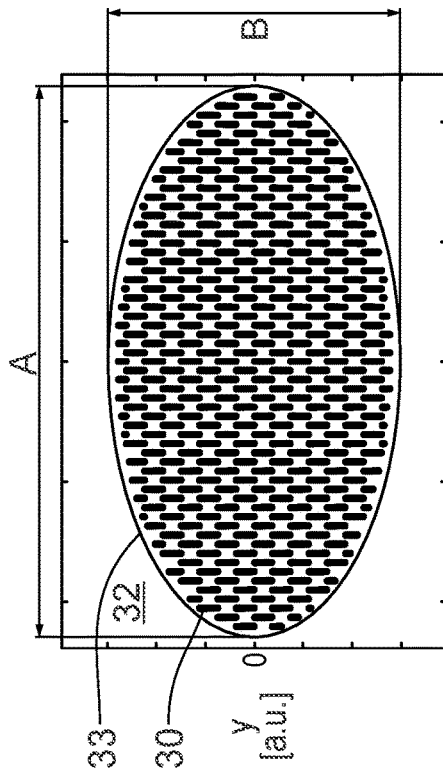

FIGS. 31 and 32 show sub-pupil region arrangements corresponding to those of FIGS. 27, 28, wherein, unlike in FIGS. 25 to 29, the illumination-predetermining facet mirror 7 is not arranged in a pupil plane, but rather at a distance therefrom. This once again results in a confluence of the sub-pupil regions 30 in the y-dimension.

Figure 33:
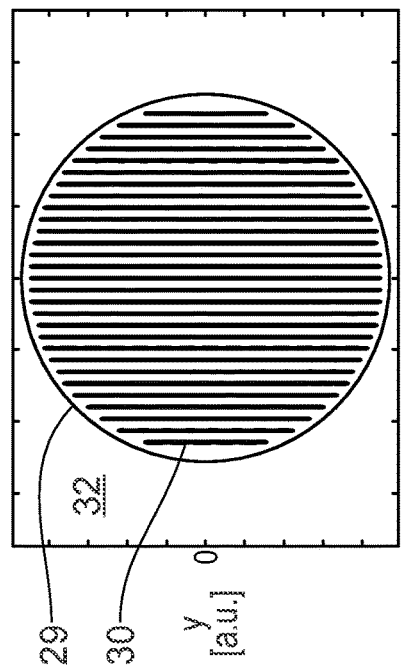
FIGS. 33 and 34 show, in an illustration similar to FIGS. 31 and 32, a further arrangement of the sub-pupil regions with a line-by-line offset.
Figure 34:
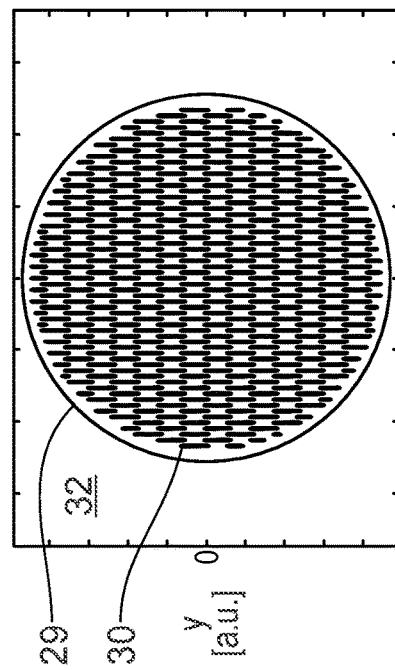
Figure 36:
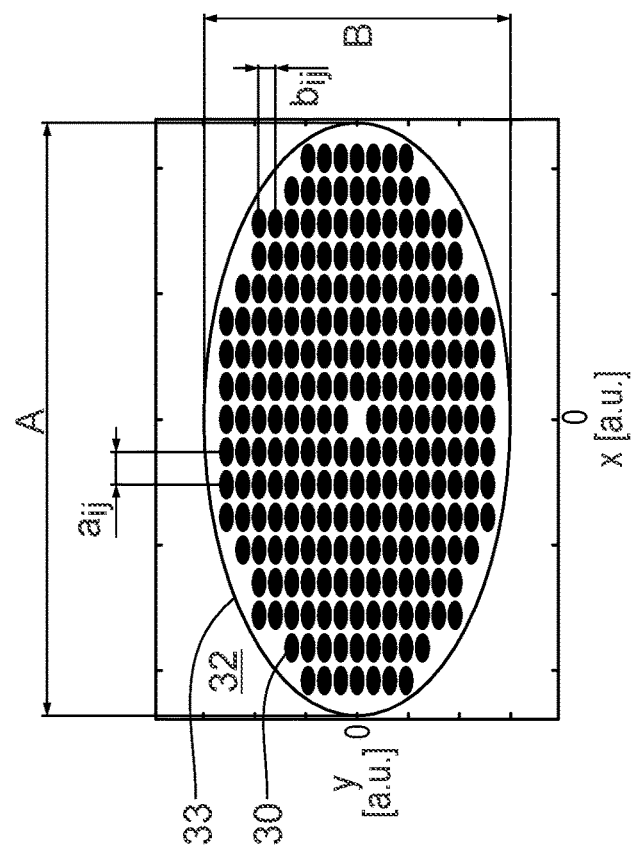
FIGS. 35 and 36 show, in an illustration similar to FIGS. 27 and 28, an arrangement of sub-pupil regions which are embodied to be round in the exit pupil of the projection optical unit and elliptical in the illumination pupil of the illumination optical unit.
Figure 35:
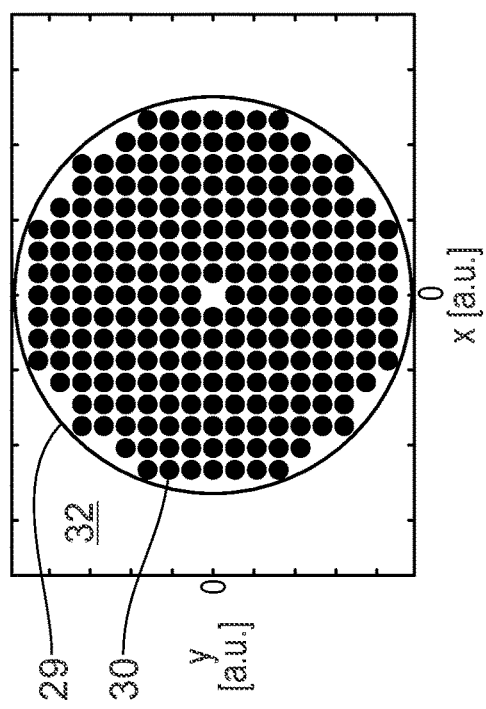

FIGS. 33 and 34 show the situation of the arrangement of the sub-pupil regions when using an illumination-predetermining setting mirror arranged at a distance from the pupil plane, wherein the sub-pupil regions 30 are arranged firstly in an offset manner and secondly in a densely packed manner, comparable to FIGS. 29 and 30. This results in practically complete filling of the exit pupil of the projection optical unit 10, without unimpinged regions.

FIGS. 35 and 36 show, once again comparable to FIGS. 15 and 16, the situation with elliptical sub-pupil regions in the illumination pupil (cf. FIG. 36) and round resultant sub-pupil regions 30 in the exit pupil of the projection optical unit 10 as a result of the anamorphic effect of the projection optical unit 10.

Figure 37:
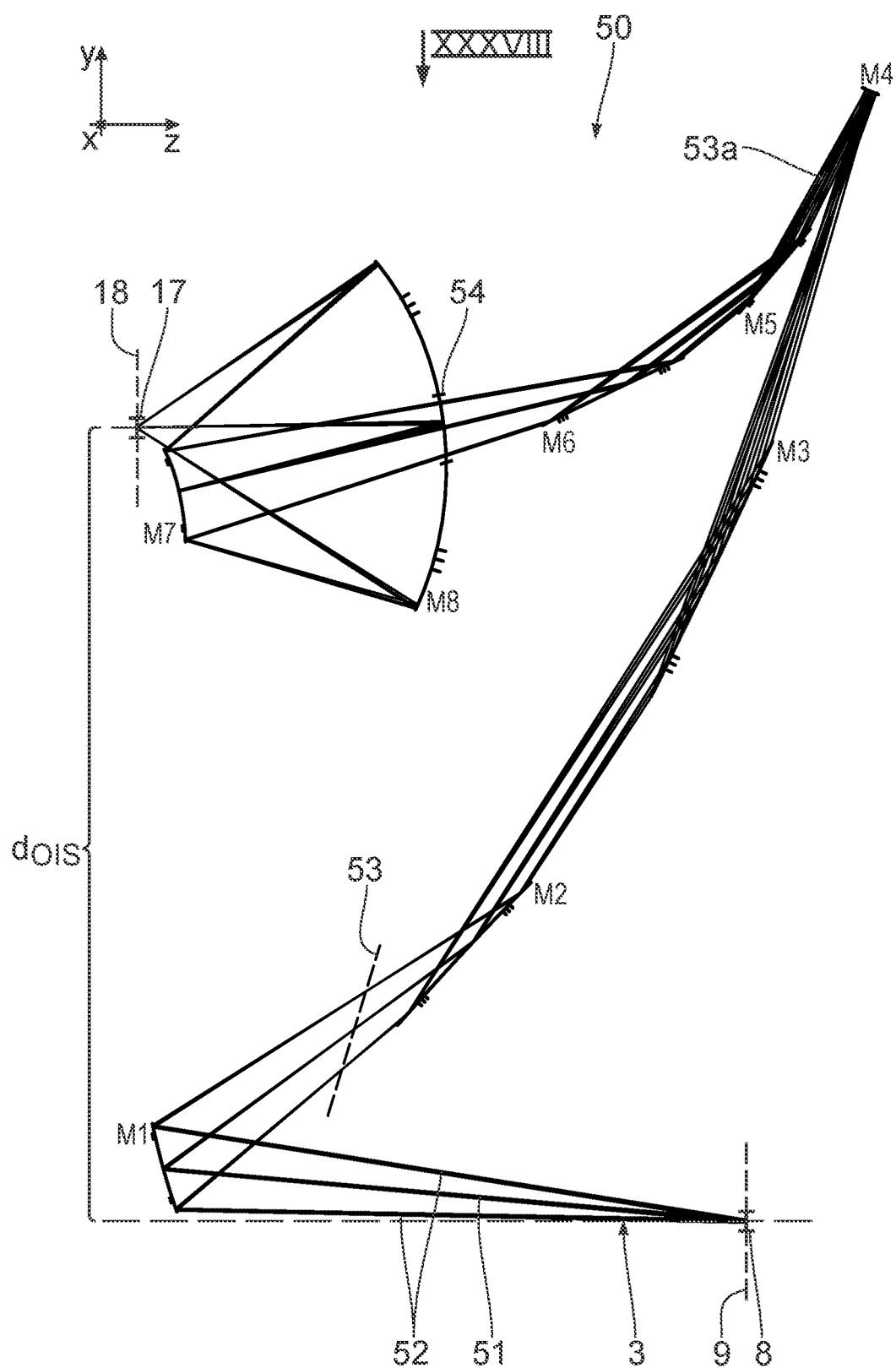
FIG. 37 shows, in a meridional section, an embodiment of an imaging optical unit which can be used as a projection lens in the projection exposure apparatus according to FIG. 1, wherein an imaging beam path for chief rays and for an upper and a lower coma ray of two selected field points is depicted, embodied as an object-side anamorphic optical unit.
Figure 38:
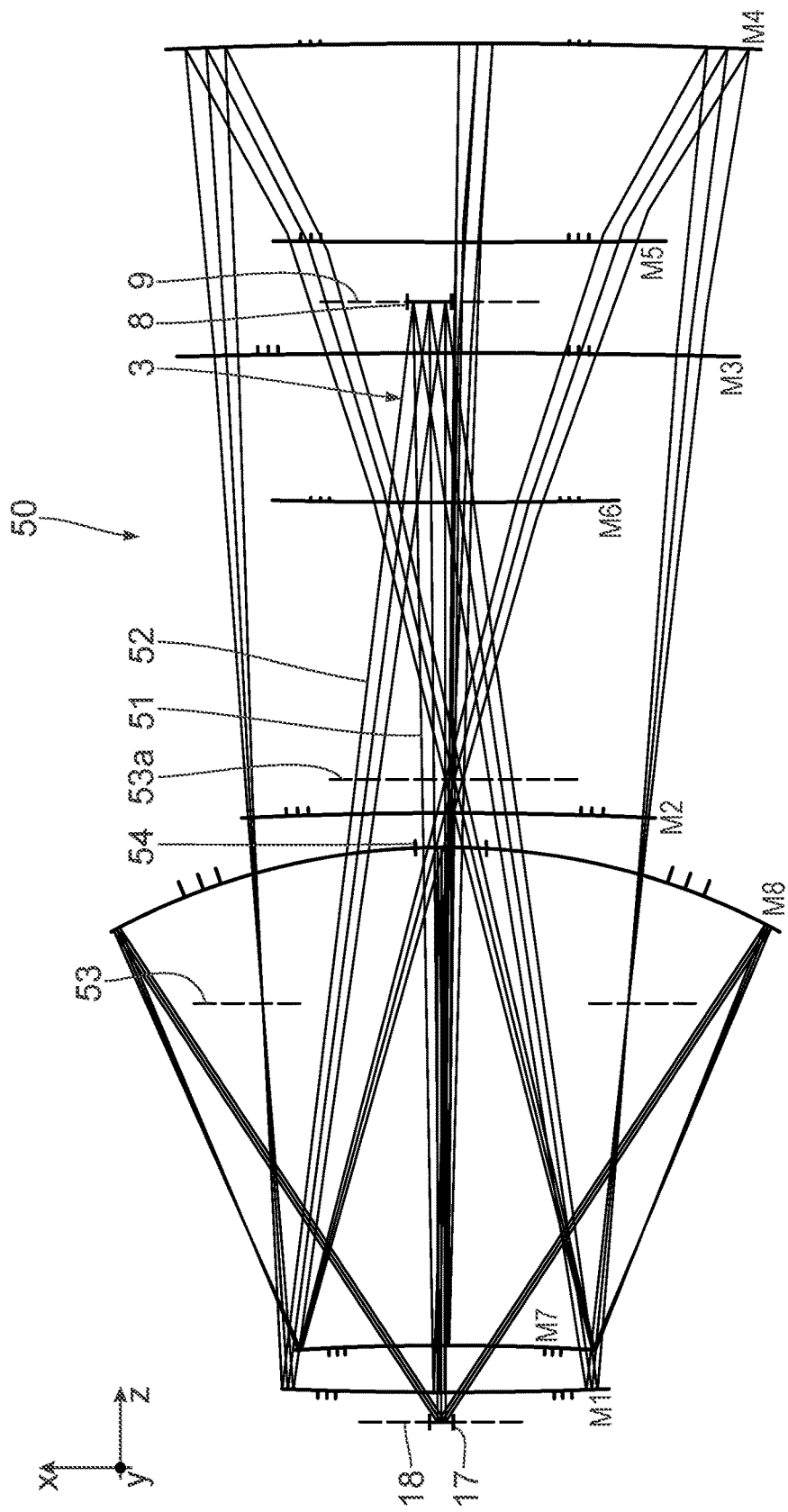
FIG. 38 shows a view of the imaging optical unit according to FIG. 37, seen from the viewing direction XXXVIII in FIG. 37.

FIGS. 37 and 38 show the optical design of a further embodiment of a projection optical unit 50, which can be used in the projection exposure apparatus 1 in place of the projection optical unit 10. What is depicted in FIGS. 37 and 38 is, in each case, the beam path of three individual rays, which emanate from the object field points spaced apart in the y-direction in FIGS. 37 and 38. What is depicted are chief rays 51, i.e. individual rays which pass through the centre of a pupil in a pupil plane of the projection optical unit 50, and in each case an upper and lower coma ray 52 of these object field points. FIG. 37 shows a meridional section of the projection optical unit 50. FIG. 38 shows a sagittal view of the projection optical unit 50.

Proceeding from the object field 8, the chief rays 51 include an angle CRAO of 5.1° with a normal of the object plane 9.

The object plane 9 lies parallel to the image plane 18.

The projection optical unit 50 has an image-side numerical aperture of 0.55.

The projection optical unit 50 according to FIG. 2 has a total of eight mirrors which, in the sequence of the beam path of the individual rays 15 emanating from the object field 8, are numbered M1 to M8 in sequence. Such an imaging optical unit can also have a different number of mirrors, for example four mirrors or six mirrors.

On the object side, the projection optical unit 50 is embodied as anamorphic optical unit. In the yz-section according to FIG. 37, the projection optical unit 50 has a reducing imaging scale $\beta_y$ of ⅛. In the xz-plane perpendicular thereto (cf. FIG. 38), the projection optical unit 50 has a reducing imaging scale $\beta_x$ of ¼.

In combination with a rotationally symmetric exit pupil, these different imaging scales $\beta_x$, $\beta_y$ lead to an object-side numerical aperture being half the size in the yz-plane compared to the xz-plane, as emerges immediately from comparison between FIGS. 37 and 38. As a result of this, an advantageously small chief ray angle CRAO of 5.1° is obtained in the yz-plane.

Advantages of an anamorphic projection lens connected herewith are also discussed in US 2013/0128251 A1, which is incorporated in its entirety in this application by reference.

The anamorphic effect of the projection optical unit 50 is distributed to all optical surfaces of the mirrors M1 to M8.

FIGS. 37 and 38 depict the calculated reflection surfaces of the mirrors M1 to M8. As can be seen from the illustration according to FIGS. 37 and 38, only a portion of these calculated reflection surfaces is used. Only this actually used region of the reflection surfaces is in fact present in the real mirrors M1 to M8. These used reflection surfaces are carried by mirror bodies in a known manner.

In the projection optical unit 50, the mirrors M1, M4, M7 and M8 are embodied as mirrors for normal incidence, that is to say as mirrors on which the imaging light 3 is incident with an angle of incidence that is smaller than 45°. Thus, the projection optical unit 50 has a total of four mirrors M1, M4, M7 and M8 for normal incidence.

The mirrors M2, M3, M5 and M6 are mirrors for grazing incidence of the illumination light 3, that is to say mirrors on which the illumination light 3 is incident with angles of incidence which are greater than 60°. A typical angle of incidence of the individual rays 15 of the imaging light 3 on the mirrors M2, M3 and M5, M6 for grazing incidence lies in the region of 80°. Overall, the projection optical unit 50 includes exactly four mirrors M2, M3, M5 and M6 for grazing incidence.

The mirrors M2 and M3 form a mirror pair arranged directly in succession in the beam path of the imaging light 3. The mirrors M5 and M6 also form a mirror pair arranged directly in succession in the beam path of the imaging light 3.

The mirror pairs M2, M3 on the one hand and M5, M6 on the other hand reflect the imaging light 3 in such a way that the angles of reflection of the individual rays on the respective mirrors M2, M3 or M5, M6 of these two mirror pairs add up. Thus, the respective second mirror M3 and M6 of the respective mirror pair M2, M3 and M5, M6 amplifies a deflecting effect which the respective first mirror M2, M5 exerts on the respective individual ray. This arrangement of the mirrors of the mirror pairs M2, M3 and M5, M6, respectively, corresponds to that described in DE 10 2009 045 096 A1 for an illumination optical unit.

The mirrors M2, M3, M5 and M6 for grazing incidence in each case have very large absolute values for the radius, i.e. have a relatively small deviation from a plane surface. These mirrors M2, M3, M5 and M6 for grazing incidence therefore have practically no refractive power, i.e. practically no overall beam-forming effect like a concave or convex mirror, but contribute to specific and, in particular, to local aberration correction.

The mirrors M1 to M8 carry a coating optimizing the reflectivity of the mirrors M1 to M8 for the imaging light 3. This can be a ruthenium coating, a molybdenum coating or a molybdenum coating with an uppermost layer made of ruthenium. In the mirrors M2, M3, M5 and M6 for grazing incidence, use can be made of a coating with e.g. a ply made of molybdenum or ruthenium. These highly reflecting layers, in particular of mirrors M1, M4, M7 and M8 for normal incidence, can be embodied as multi-ply layers, wherein successive layers can be manufactured from different materials. Use can also be made of alternating material layers. A typical multi-ply layer can include 50 bi-plies made of in each case a layer of molybdenum and a layer of silicon.

The mirror M8, i.e. the last mirror in the imaging beam path in front of the image field 8, has a passage opening 54 for the imaging light 3, which is reflected from the antepenultimate mirror M6 to the penultimate mirror M7, to pass through. The mirror M8 is used in a reflective manner around the passage opening 54. All other mirrors M1 to M7 do not include a passage opening and are used in a reflective manner in a continuous region without gaps.

The mirrors M1 to M8 are embodied as free-form surfaces which cannot be described by a rotationally symmetric function. Other embodiments of the projection optical unit 50, in which at least one of the mirrors M1 to M8 is embodied as a rotationally symmetric asphere, are also possible. It is also possible for all mirrors M1 to M8 to be embodied as such aspheres.

A free-form surface can be described by the following free-form surface equation (equation 1):

$$Z_{PH} = \frac{c_x x^2 + c_y y^2}{1 + \sqrt{1 - ((1+k_x)(c_x x)^2 - (1+k_y)(c_y y)^2}} + \quad (1)$$
$$C_1 x + C_2 y + C_3 x^2 + C_4 xy + C_5 y^2 + C_6 x^3 + \ldots +$$
$$C_9 y^3 + C_{10} x^4 + \ldots + C_{12} x^2 y^2 + \ldots + C_{14} y^4 + C_{15} x^5 +$$
$$\ldots + C_{20} y^5 + C_{21} x^6 + \ldots + C_{24} x^3 y^3 + \ldots + C_{27} y^6 + \ldots$$

The following applies to the parameters of this equation (1):

$Z_{PH}$ is the sag of the free-form surface at the point x, y, where $x^2 + y^2 = r^2$. Here, r is the distance from the reference axis of the free-form surface equation (x=0; y=0).

In the free-form surface equation (1), $C_1$, $C_2$, $C_3$ ... denote the coefficients of the free-form surface series expansion in powers of x and y.

In the case of a conical base area, $c_x$, $c_y$ is a constant corresponding to the vertex curvature of a corresponding asphere. Thus, $c_x = 1/R_x$ and $c_y = 1/R_y$ applies. $k_x$ and $k_y$ each correspond to a conical constant of a corresponding asphere. Thus, equation (1) describes a bi-conical free-form surface.

An alternative possible free-form surface can be generated from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and the gradients associated therewith. Depending on the respective type of the spline surface, the complete surface is obtained by interpolation between the grid points using e.g. polynomials or functions which have specific properties in respect of the continuity and the differentiability thereof. Examples for this are analytical functions.

The optical design data of the reflection surfaces of the mirrors M1 to M8 of the projection optical unit 50 can be gathered from the following tables. These optical design data in each case proceed from the image plane 18, i.e. describe the respective projection optical unit in the reverse propagation direction of the imaging light 3 between the image plane 18 and the object plane 9.

The first one of these tables specifies a vertex radius (radius=R=$R_y$) for the optical surfaces of the optical components.

The second table specifies, for the mirrors M1 to M8 in mm, the conical constants $k_x$ and $k_y$, the vertex radius $R_x$ possibly deviating from the value R (=$R_y$) and the free-form surface coefficients $C_n$.

The third table still specifies the magnitude along which the respective mirror, proceeding from a reference surface, was decentred (DCY) in the y-direction, and displaced (DCZ) and tilted (TLA, TLC) in the z-direction. This corresponds to a parallel displacement and a tilt when carrying out the free-form surface design method. Here, a displacement is carried out in the y-direction and in the z-direction in mm, and tilting is carried out about the x-axis and about the z-axis. Here, the tilt angle is specified in degrees. Decentring is carried out first, followed by tilting. The reference surface during decentring is in each case the first surface of the specified optical design data. Decentring in the y-direction and in the z-direction is also specified for the object field 8.

The fourth table still specifies the transmission data of the mirrors M8 to M1, namely the reflectivity thereof for the angle of incidence of an illumination light ray incident centrally on the respective mirror. The overall transmission is specified as a proportional factor remaining from an incident intensity after reflection at all mirrors in the projection optical unit.

Table 1 for FIG. 37/38

| SURFACE | RADIUS = $R_y$ | THICKNESS | OPERATING MODE |
|---|---|---|---|
| Image plane | 0 | 0 | |
| M8 | −1023.649 | 0 | REFL |
| M7 | 690.912 | 0 | REFL |
| M6 | 10074.889 | 0 | REFL |
| M5 | 72950.754 | 0 | REFL |
| M4 | −4292.992 | 0 | REFL |
| M3 | −21913.738 | 0 | REFL |
| M2 | 7573.476 | 0 | REFL |
| Stop | 0 | 0 | |
| M1 | −1898.455 | 0 | REFL |
| Object plane | 0 | 0 | |

Table 2a for FIG. 37/38

| FREE-FORM | COEFFICIENTS | | |
|---|---|---|---|
| Surface | M8 | M7 | M6 |
| KY | 0 | 0 | 0 |
| KX | 0 | 0 | 0 |
| RX | −1133.327 | 4406.388 | 4739.62 |
| C1 | — | — | — |
| C2 | — | — | — |
| C3 | — | — | — |
| C4 | — | — | — |
| C5 | — | — | — |

| Table 2a for FIG. 37/38 | | | |
|---|---|---|---|
| FREE-FORM Surface | COEFFICIENTS M8 | M7 | M6 |
| C6 | — | — | — |
| C7 | −1.37046E−08 | 7.46796E−08 | −2.88085E−08 |
| C8 | — | — | — |
| C9 | −7.61542E−09 | −1.45727E−07 | −1.79062E−08 |
| C10 | −7.69204E−12 | 2.92797E−10 | 4.42007E−11 |
| C11 | — | — | — |
| C12 | −2.20924E−11 | 1.13531E−09 | −8.60192E−12 |
| C13 | — | — | — |
| C14 | −1.03739E−11 | 1.40909E−09 | −4.58761E−11 |
| C15 | — | — | — |
| C16 | −7.31775E−15 | −1.31555E−13 | −1.45618E−13 |
| C17 | — | — | — |
| C18 | −1.17172E−14 | −6.54063E−13 | 4.24616E−15 |
| C19 | — | — | — |
| C20 | −3.39836E−15 | −3.50696E−13 | −8.53811E−14 |
| C21 | −9.15895E−18 | 2.09018E−16 | −9.75509E−17 |
| C22 | — | — | — |
| C23 | −3.59919E−17 | 2.50711E−15 | 3.58425E−16 |
| C24 | — | — | — |
| C25 | −3.77288E−17 | 9.96925E−15 | −1.56598E−19 |
| C26 | — | — | — |
| C27 | −1.19641E−17 | 7.56227E−15 | −2.28738E−16 |
| C28 | — | — | — |
| C29 | −5.7505E−21 | 8.60467E−19 | −9.7608E−19 |
| C30 | — | — | — |
| C31 | −1.25791E−20 | 4.3679E−18 | −8.89549E−19 |
| C32 | — | — | — |
| C33 | −1.03116E−20 | −9.69396E−18 | −3.40251E−19 |
| C34 | — | — | — |
| C35 | −2.20183E−21 | −3.27752E−18 | −6.53545E−19 |
| C36 | −8.33158E−24 | 4.55265E−22 | 4.12908E−21 |
| C37 | — | — | — |
| C38 | −4.25998E−23 | 7.24917E−21 | 1.05887E−20 |
| C39 | — | — | — |
| C40 | −6.98306E−23 | 1.4359E−20 | 3.05154E−21 |
| C41 | — | — | — |
| C42 | −4.83368E−23 | 8.43034E−20 | 2.41518E−23 |
| C43 | — | — | — |
| C44 | −1.40394E−23 | 1.97591E−19 | −1.62504E−21 |
| C45 | — | — | — |
| C46 | −2.98149E−27 | −4.16141E−25 | 6.47813E−23 |
| C47 | — | — | — |
| C48 | −1.122E−26 | −9.85706E−24 | 2.803E−23 |
| C49 | — | — | — |
| C50 | −1.69711E−26 | 4.0986E−23 | 1.52688E−23 |
| C51 | — | — | — |
| C52 | −8.57563E−27 | 1.47028E−22 | 7.02363E−24 |
| C53 | — | — | — |
| C54 | 1.76715E−28 | −6.99745E−23 | −2.14952E−24 |
| C55 | −6.6289E−30 | 1.4211E−27 | −2.82086E−25 |
| C56 | — | — | — |
| C57 | −4.1087E−29 | −4.51003E−27 | −7.63378E−25 |
| C58 | — | — | — |
| C59 | −9.17862E−29 | 7.25468E−26 | −2.77481E−25 |
| C60 | — | — | — |
| C61 | −9.90356E−29 | 3.9633E−25 | −3.52163E−26 |
| C62 | — | — | — |
| C63 | −5.59488E−29 | 9.9557E−25 | −8.0433E−28 |
| C64 | — | — | — |
| C65 | −7.22003E−30 | −4.21378E−24 | −2.7441E−27 |
| C66 | — | — | — |
| C67 | −5.2462E−33 | −8.35762E−30 | −9.15485E−28 |
| C68 | — | — | — |
| C69 | −2.01841E−32 | 5.45404E−29 | −5.39668E−28 |
| C70 | — | — | — |
| C71 | −3.79283E−32 | −2.97201E−28 | −1.38363E−27 |
| C72 | — | — | — |
| C73 | −2.44971E−32 | 3.25228E−28 | −3.68929E−28 |
| C74 | — | — | — |
| C75 | −7.62728E−33 | −8.72124E−27 | −1.16531E−28 |
| C76 | — | — | — |
| C77 | −5.73596E−33 | 4.80554E−27 | −4.1739E−29 |
| C78 | −8.04718E−36 | −8.23504E−33 | 7.06018E−30 |
| C79 | — | — | — |
| C80 | −5.44037E−35 | 2.3497E−31 | 1.8604E−29 |
| C81 | — | — | — |
| C82 | −1.67551E−34 | 1.33047E−30 | 1.34215E−29 |
| C83 | — | — | — |
| C84 | −2.69006E−34 | 5.04719E−30 | 4.72484E−30 |
| C85 | — | — | — |
| C86 | −2.38084E−34 | −7.8081E−30 | 4.75456E−31 |
| C87 | — | — | — |
| C88 | −9.66546E−35 | 1.17081E−29 | −1.51989E−31 |
| C89 | — | — | — |
| C90 | −2.31042E−35 | 9.71583E−29 | −2.31509E−31 |
| C91 | — | — | — |
| C92 | 3.72879E−39 | 1.17935E−34 | 3.77091E−34 |
| C93 | — | — | — |
| C94 | 1.51419E−38 | −8.62572E−36 | −7.82263E−33 |
| C95 | — | — | — |
| C96 | 3.40542E−38 | 3.38357E−33 | 3.57456E−32 |
| C97 | — | — | — |
| C98 | 3.58688E−38 | −2.30441E−34 | 1.60062E−32 |
| C99 | — | — | — |
| C100 | −4.37696E−39 | −7.67778E−33 | 1.17808E−33 |
| C101 | — | — | — |
| C102 | −9.00259E−39 | 1.15561E−31 | 4.06368E−34 |
| C103 | — | — | — |
| C104 | 9.73218E−39 | −1.33023E−31 | −5.19168E−34 |
| C105 | −3.15681E−43 | 8.50011E−38 | −6.16414E−35 |
| C106 | — | — | — |
| C107 | −6.71085E−42 | −3.50192E−37 | −1.25785E−34 |
| C108 | — | — | — |
| C109 | 1.81014E−41 | −3.77113E−36 | −1.73593E−34 |
| C110 | — | — | — |
| C111 | 1.21189E−40 | −1.794E−35 | −1.92853E−34 |
| C112 | — | — | — |
| C113 | 2.123E−40 | 4.42096E−35 | −1.73175E−35 |
| C114 | — | — | — |
| C115 | 1.96802E−40 | 3.78746E−34 | −5.80389E−36 |
| C116 | — | — | — |
| C117 | 6.74688E−41 | −4.5593E−35 | 7.2231E−37 |
| C118 | — | — | — |
| C119 | 1.51521E−41 | −4.50735E−34 | −4.27492E−37 |
| C120 | — | — | — |
| C121 | −3.77954E−45 | — | — |
| C122 | — | — | — |
| C123 | −5.73507E−44 | — | — |
| C124 | — | — | — |
| C125 | −1.67582E−43 | — | — |
| C126 | — | — | — |
| C127 | −2.67358E−43 | — | — |
| C128 | — | — | — |
| C129 | −2.40297E−43 | — | — |
| C130 | — | — | — |
| C131 | −8.92457E−44 | — | — |
| C132 | — | — | — |
| C133 | −1.44216E−44 | — | — |
| C134 | — | — | — |
| C135 | −1.25305E−44 | — | — |
| C136 | −1.34457E−47 | — | — |
| C137 | — | — | — |
| C138 | −1.15918E−46 | — | — |
| C139 | — | — | — |
| C140 | −4.92021E−46 | — | — |
| C141 | — | — | — |
| C142 | −1.26164E−45 | — | — |
| C143 | — | — | — |
| C144 | −1.92457E−45 | — | — |
| C145 | — | — | — |
| C146 | −1.81299E−45 | — | — |
| C147 | — | — | — |
| C148 | −1.06311E−45 | — | — |
| C149 | — | — | — |

Table 2a for FIG. 37/38

| FREE-FORM Surface | COEFFICIENTS | | |
|---|---|---|---|
| | M8 | M7 | M6 |
| C150 | −3.31314E−46 | — | — |
| C151 | — | — | — |
| C152 | −4.79752E−47 | — | — |

Table 2b for FIG. 37/38

| FREE-FORM Surface | COEFFICIENTS | | |
|---|---|---|---|
| | M5 | M4 | M3 |
| KY | 0 | 0 | 0 |
| KX | 0 | 0 | 0 |
| RX | 21144.94 | −2867.384 | −10853.57 |
| C1 | — | — | — |
| C2 | — | — | — |
| C3 | — | — | — |
| C4 | — | — | — |
| C5 | — | — | — |
| C6 | — | — | — |
| C7 | −8.13272E−08 | −3.58842E−08 | 5.29877E−10 |
| C8 | — | — | — |
| C9 | −5.82176E−08 | −7.04519E−07 | 2.10519E−09 |
| C10 | 9.37453E−12 | 1.30052E−12 | −6.304E−12 |
| C11 | — | — | — |
| C12 | 3.0068E−11 | 1.85556E−10 | −5.20862E−12 |
| C13 | — | — | — |
| C14 | 8.83038E−11 | 3.58735E−09 | −3.58046E−12 |
| C15 | — | — | — |
| C16 | 4.50889E−14 | −8.90737E−15 | 1.13558E−14 |
| C17 | — | — | — |
| C18 | −8.85587E−15 | −1.37507E−12 | −1.13089E−16 |
| C19 | — | — | — |
| C20 | −2.84536E−13 | −2.40161E−11 | 1.26937E−15 |
| C21 | −4.026E−17 | 9.8411E−19 | −1.07754E−17 |
| C22 | — | — | — |
| C23 | −1.60628E−16 | 1.18787E−16 | −4.13075E−18 |
| C24 | — | — | — |
| C25 | −2.12462E−16 | 1.07306E−14 | −2.61988E−18 |
| C26 | — | — | — |
| C27 | 7.88492E−16 | 1.62876E−13 | −1.51826E−18 |
| C28 | — | — | — |
| C29 | 8.29817E−20 | −1.42316E−21 | 8.37815E−21 |
| C30 | — | — | — |
| C31 | 4.09821E−19 | −1.5316E−18 | 2.70593E−21 |
| C32 | — | — | — |
| C33 | 1.04061E−18 | −1.00777E−16 | 9.75607E−22 |
| C34 | — | — | — |
| C35 | −2.28977E−18 | −1.25475E−15 | 1.00242E−21 |
| C36 | −1.07019E−22 | 1.36622E−24 | −3.00882E−23 |
| C37 | — | — | — |
| C38 | −4.94074E−23 | 2.88428E−23 | 2.10003E−24 |
| C39 | — | — | — |
| C40 | −1.34527E−21 | 1.98697E−20 | 8.31511E−24 |
| C41 | — | — | — |
| C42 | −4.60973E−21 | 1.12696E−18 | 3.79722E−24 |
| C43 | — | — | — |
| C44 | 4.81654E−21 | 1.64452E−17 | −1.75074E−25 |
| C45 | — | — | — |
| C46 | 1.01636E−24 | −5.39059E−27 | 2.00076E−26 |
| C47 | — | — | — |
| C48 | −9.38769E−25 | 6.02028E−25 | 1.15957E−26 |
| C49 | — | — | — |
| C50 | −7.09697E−24 | 1.64761E−22 | −5.38273E−27 |
| C51 | — | — | — |
| C52 | −2.38403E−24 | 3.42328E−21 | −2.97502E−27 |
| C53 | — | — | — |
| C54 | −2.2624E−23 | −3.23207E−19 | −5.02184E−28 |
| C55 | 1.26386E−28 | 1.71521E−30 | 9.81733E−30 |
| C56 | — | — | — |
| C57 | −2.83068E−27 | 8.4656E−29 | −3.36675E−29 |
| C58 | — | — | — |
| C59 | 2.46205E−26 | −1.62711E−26 | −9.5445E−29 |
| C60 | — | — | — |
| C61 | 9.95586E−26 | −8.1993E−24 | −8.78075E−29 |
| C62 | — | — | — |
| C63 | 1.01879E−25 | 1.62251E−22 | −3.16475E−29 |
| C64 | — | — | — |
| C65 | 1.91562E−25 | −5.94818E−21 | −4.32421E−30 |
| C66 | — | — | — |
| C67 | −3.0812E−30 | −1.7543E−33 | −6.87806E−32 |
| C68 | — | — | — |
| C69 | 4.41107E−30 | −4.3076E−30 | −8.63344E−32 |
| C70 | — | — | — |
| C71 | −2.84725E−29 | −2.73981E−27 | 6.96849E−32 |
| C72 | — | — | — |
| C73 | 4.49515E−30 | −1.83905E−25 | 8.79586E−32 |
| C74 | — | — | — |
| C75 | 8.74288E−29 | −8.91906E−24 | 2.23941E−32 |
| C76 | — | — | — |
| C77 | −6.92551E−28 | 2.64874E−22 | 4.81132E−33 |
| C78 | 2.23688E−34 | −1.85559E−36 | −5.94735E−35 |
| C79 | — | — | — |
| C80 | −7.09239E−33 | −8.8033E−35 | 1.42958E−34 |
| C81 | — | — | — |
| C82 | −2.40355E−31 | 1.32753E−31 | 3.76355E−34 |
| C83 | — | — | — |
| C84 | −1.33477E−30 | 6.70625E−29 | 4.22629E−34 |
| C85 | — | — | — |
| C86 | −3.52927E−30 | 4.70367E−27 | 2.6854E−34 |
| C87 | — | — | — |
| C88 | −4.04945E−30 | −1.60136E−25 | 9.37755E−35 |
| C89 | — | — | — |
| C90 | −2.28582E−32 | 3.37935E−24 | 1.01872E−35 |
| C91 | — | — | — |
| C92 | 1.53054E−35 | 1.03182E−38 | 4.49578E−37 |
| C93 | — | — | — |
| C94 | 1.90636E−34 | 7.96148E−37 | 4.15344E−37 |
| C95 | — | — | — |
| C96 | 1.77216E−33 | 5.60447E−33 | −1.332E−37 |
| C97 | — | — | — |
| C98 | 7.04888E−33 | 5.29126E−31 | −4.53303E−37 |
| C99 | — | — | — |
| C100 | 1.53325E−32 | 6.99281E−29 | −2.18759E−37 |
| C101 | — | — | — |
| C102 | 1.55848E−32 | — | −2.6401E−38 |
| C103 | — | — | — |
| C104 | 5.50738E−33 | — | −5.86276E−39 |
| C105 | −3.2947E−39 | 2.07879E−42 | −7.97362E−43 |
| C106 | — | — | — |
| C107 | −6.0305E−38 | 8.43169E−40 | −9.19642E−40 |
| C108 | — | — | — |
| C109 | −5.38471E−37 | −2.34624E−37 | −7.68527E−40 |
| C110 | — | — | — |
| C111 | −3.36031E−36 | −1.09111E−34 | −5.25252E−40 |
| C112 | — | — | — |
| C113 | −1.05801E−35 | −2.66123E−32 | −3.43775E−40 |
| C114 | — | — | — |
| C115 | −2.05318E−35 | — | −3.04774E−40 |
| C116 | — | — | — |
| C117 | −1.88192E−35 | — | −1.37941E−40 |
| C118 | — | — | — |
| C119 | −9.04484E−36 | — | −1.23379E−41 |
| C120 | — | — | — |
| C121 | — | — | — |
| C122 | — | — | — |
| C123 | — | — | — |
| C124 | — | — | — |
| C125 | — | — | — |
| C126 | — | — | — |
| C127 | — | — | — |
| C128 | — | — | — |
| C129 | — | — | — |
| C130 | — | — | — |

| Table 2b for FIG. 37/38 | | | |
|---|---|---|---|
| FREE-FORM | COEFFICIENTS | | |
| Surface | M5 | M4 | M3 |
| C131 | — | — | |
| C132 | — | — | |
| C133 | — | — | |
| C134 | — | — | |
| C135 | — | — | |
| C136 | — | — | |
| C137 | — | — | |
| C138 | — | — | |
| C139 | — | — | |
| C140 | — | — | |
| C141 | — | — | |
| C142 | — | — | |
| C143 | — | — | |
| C144 | — | — | |
| C145 | — | — | |
| C146 | — | — | |
| C147 | — | — | |
| C148 | — | — | |
| C149 | — | — | |
| C150 | — | — | |
| C151 | — | — | |
| C152 | — | — | |

| Table 2c for FIG. 37/38 | | | |
|---|---|---|---|
| FREE-FORM | COEFFICIENTS | | |
| Surface | M2 | Stop | M1 |
| KY | 0 | 0 | 0 |
| KX | 0 | 0 | 0 |
| RX | −5190.311 | 0 | −5923.957 |
| C1 | — | — | — |
| C2 | — | — | — |
| C3 | — | — | — |
| C4 | — | — | — |
| C5 | — | — | — |
| C6 | — | — | — |
| C7 | −5.28973E−09 | — | −9.34107E−08 |
| C8 | — | — | — |
| C9 | 3.16118E−08 | — | −3.08171E−08 |
| C10 | −3.51132E−11 | — | 2.15749E−11 |
| C11 | — | — | — |
| C12 | −5.9484E−11 | — | −4.16147E−11 |
| C13 | — | — | — |
| C14 | 4.15397E−11 | — | −9,.60233E−12 |
| C15 | — | — | — |
| C16 | 8.87193E−14 | — | −1.3871E−13 |
| C17 | — | — | — |
| C18 | 2.11911E−14 | — | −4.21724E−13 |
| C19 | — | — | — |
| C20 | 5.83626E−14 | — | 1.56832E−13 |
| C21 | −7.52771E−17 | — | 2.28833E−17 |
| C22 | — | — | — |
| C23 | 2.86727E−17 | — | −7.98916E−17 |
| C24 | — | — | — |
| C25 | −6.0786E−17 | — | −6.15893E−16 |
| C26 | — | — | — |
| C27 | 9.82617E−17 | — | 6.98314E−16 |
| C28 | — | — | — |
| C29 | −1.4409E−21 | — | −1.67085E−20 |
| C30 | — | — | — |
| C31 | 1.0419E−19 | — | 1.2491E−19 |
| C32 | — | — | — |
| C33 | 1.81953E−20 | — | −5.55657E−19 |
| C34 | — | — | — |
| C35 | 2.04228E−19 | — | −3.23337E−18 |
| C36 | −1.68994E−23 | — | −3.08541E−25 |
| C37 | — | — | — |
| C38 | −5.92116E−23 | — | −6.92334E−22 |

| Table 2c for FIG. 37/38 | | | |
|---|---|---|---|
| FREE-FORM | COEFFICIENTS | | |
| Surface | M2 | Stop | M1 |
| C39 | — | — | — |
| C40 | 3.83068E−23 | — | −1.17222E−21 |
| C41 | — | — | — |
| C42 | −9.3194E−23 | — | 1.57625E−21 |
| C43 | — | — | — |
| C44 | 3.54806E−22 | — | −4.85283E−20 |
| C45 | — | — | — |
| C46 | 1.64543E−25 | — | 7.61057E−26 |
| C47 | — | — | — |
| C48 | −2.94839E−25 | — | 1.52897E−24 |
| C49 | — | — | — |
| C50 | −1.09554E−24 | — | 8.66858E−24 |
| C51 | — | — | — |
| C52 | −1.81473E−24 | — | 2.18885E−23 |
| C53 | — | — | — |
| C54 | −1.10156E−25 | — | 2.98501E−22 |
| C55 | −3.91687E−28 | — | −3.84029E−29 |
| C56 | — | — | — |
| C57 | −9.77389E−28 | — | 8.12605E−27 |
| C58 | — | — | — |
| C59 | −6.1463E−28 | — | 4.79733E−26 |
| C60 | — | — | — |
| C61 | −1.2791E−27 | — | 3.31526E−26 |
| C62 | — | — | — |
| C63 | −4.46201E−27 | — | −2.96899E−25 |
| C64 | — | — | — |
| C65 | −2.14425E−28 | — | 2.24301E−24 |
| C66 | — | — | — |
| C67 | 3.17154E−32 | — | −3.989E−30 |
| C68 | — | — | — |
| C69 | 6.31254E−30 | — | −4.30684E−29 |
| C70 | — | — | — |
| C71 | 1.77074E−29 | — | −3.09346E−28 |
| C72 | — | — | — |
| C73 | 2.94127E−29 | — | −3.27636E−28 |
| C74 | — | — | — |
| C75 | 1.73718E−29 | — | 1.84376E−28 |
| C76 | — | — | — |
| C77 | 9.59406E−30 | — | −9.29243E−27 |
| C78 | 2.26428E−33 | — | 6.44291E−34 |
| C79 | — | — | — |
| C80 | 6.98016E−33 | — | −7.26103E−32 |
| C81 | — | — | — |
| C82 | 3.90295E−33 | — | −8.26037E−31 |
| C83 | — | — | — |
| C84 | 1.00564E−32 | — | −2.47229E−30 |
| C85 | — | — | — |
| C86 | 5.31207E−32 | — | 1.36268E−30 |
| C87 | — | — | — |
| C88 | 4.68167E−32 | — | 1.15589E−29 |
| C89 | — | — | — |
| C90 | 2.22751E−32 | — | −6.48766E−29 |
| C91 | — | — | — |
| C92 | 4.94909E−36 | — | 2.12374E−35 |
| C93 | — | — | — |
| C94 | −2.40459E−35 | — | 2.73288E−34 |
| C95 | — | — | — |
| C96 | −6.9107E−35 | — | 2.28463E−33 |
| C97 | — | — | — |
| C98 | −1.61919E−34 | — | 6.85275E−33 |
| C99 | — | — | — |
| C100 | −1.443E−34 | — | −4.32046E−33 |
| C101 | — | — | — |
| C102 | −7.93406E−35 | — | −1.07655E−32 |
| C103 | — | — | — |
| C104 | −1.6653E−35 | — | 1.27235E−31 |
| C105 | 5.86499E−40 | — | −4.29231E−39 |
| C106 | — | — | — |
| C107 | −1.54194E−38 | — | 2.35882E−37 |
| C108 | — | — | — |
| C109 | −7.13318E−39 | — | 4.70203E−36 |
| C110 | — | — | — |
| C111 | −1.43456E−38 | — | 2.37591E−35 |

-continued

Table 2c for FIG. 37/38

| FREE-FORM | COEFFICIENTS | | |
|---|---|---|---|
| Surface | M2 | Stop | M1 |
| C112 | — | — | — |
| C113 | −1.90287E−37 | — | 3.22171E−35 |
| C114 | — | — | — |
| C115 | −2.94354E−37 | — | −8.87391E−35 |
| C116 | — | — | — |
| C117 | −2.19039E−37 | — | −1.98534E−34 |
| C118 | — | — | — |
| C119 | −6.06928E−38 | — | 8.31104E−34 |

Table 3a for FIG. 37/38
DECENTRING AND TILTING

| Surface | DCX | DCY | DCZ |
|---|---|---|---|
| M8 | 0 | 0.357 | 928.412 |
| M7 | 0 | −194.006 | 123.625 |
| M6 | 0 | 110.738 | 1485.211 |
| M5 | 0 | 410.249 | 1906.051 |
| M4 | 0 | 989.832 | 2227.669 |
| M3 | 0 | −480.768 | 1725.544 |
| M2 | 0 | −1586.007 | 983.729 |
| Stop | 0 | −1833.301 | 630.897 |
| M1 | 0 | −2256.97 | 48.209 |
| Object plane | 0 | −2433.049 | 1809.336 |

Table 3b for FIG. 37/38
DECENTRING

| Surface | TLA [deg] | TLB [deg] | TLC [deg] |
|---|---|---|---|
| M8 | −6.812 | 0 | 0 |
| M7 | 166.853 | 0 | 0 |
| M6 | 65.471 | 0 | 0 |
| M5 | 41.134 | 0 | 0 |
| M4 | −66.253 | 0 | 0 |
| M3 | 26.326 | 0 | 0 |
| M2 | 43.988 | 0 | 0 |
| Stop | 17.853 | 0 | 0 |
| M1 | 165.032 | 0 | 0 |
| Object plane | 0.842 | 0 | 0 |

Table 4 for FIG. 37/38
TRANSMISSION

| Surface | Angle of incidence [deg] | Reflectivity |
|---|---|---|
| M8 | 6.791 | 0.661 |
| M7 | 0.473 | 0.666 |
| M6 | 78.111 | 0.852 |
| M5 | 77.566 | 0.845 |
| M4 | 4.904 | 0.663 |
| M3 | 82.655 | 0.912 |
| M2 | 79.497 | 0.872 |
| M1 | 20.679 | 0.609 |

Overall transmission = 0.10167

An overall reflectivity of the projection optical unit 50 is 10.17%.

The axes of rotation symmetry of the aspherical mirrors are generally tilted with respect to a normal of the image plane 9, as is made clear by the tilt values in the tables.

The object field 8 has an x-extent of two times 13 mm and a y-extent of 1.20 mm. The projection optical unit 50 is optimized for an operating wavelength of the illumination light 3 of 13.5 nm.

The projection optical unit 50 has exactly eight mirrors M1 to M8. The mirrors M2 and M3 on the one hand, and M5, M6 on the other hand are embodied as mirrors for grazing incidence and are arranged in each case as a mirror pair directly behind one another in the imaging beam path. The projection optical unit 50 has exactly four mirrors for grazing incidence, namely the mirrors M2, M3, M5 and M6. The mirrors M1, M4, M7 and M8 are embodied as mirrors for normal incidence.

In the projection optical unit 50, a stop 53 is arranged in the beam path between the mirrors M1 and M2, near the grazing incidence on the mirror M2. The stop 53 is arranged between the mirrors M1 and M2 in the region of a first pupil plane in the beam path of the illumination or imaging light 3. This first pupil plane 53 is tilted relative to the chief ray 51 of a central field point, i.e. it includes an angle ≠90° with this chief ray. The whole beam of the imaging light 3 is accessible from all sides between the mirrors M1 and M2 in the region of this first pupil plane, and so the stop 53 embodied as an aperture stop is arranged here. Alternatively or additionally, a stop can be arranged directly on the surface of the mirror M2.

In the xz-plane (cf. FIG. 38), an entry pupil of the projection optical unit 50 lies 2740 mm in front of the object field 8 in the beam path of the illumination light. In the yz-plane, the entry pupil lies 5430 mm downstream of the object field 8 in the imaging beam path of the projection optical unit 50. An extent of the chief rays 51 emanating from the object field 8 is therefore convergent both in the meridional section according to FIG. 37 and in the view according to FIG. 38.

In the xz-section (cf. FIG. 38), the stop 53 can lie at a position displaced in the z-direction compared to its position in the yz-section.

A z-distance between the object field 8 and the image field 17, i.e. a structural length of the projection optical unit 50, is approximately 1850 mm.

An object/image offset ($d_{OIS}$), i.e. a y-spacing between a central object field point and a central image field point, is approximately 2400 mm.

A free working distance between the mirror M7 and the image field 17 is 83 mm.

In the projection optical unit 34, an RMS value for the wavefront aberration is at most 7.22 mλ and, on average, 6.65 mλ.

A maximum distortion value is at most 0.10 nm in the x-direction and at most 0.10 nm in the y-direction. A telecentricity value in the x-direction is at most 1.58 mrad on the image field side and a telecentricity value in the y-direction is at most 0.15 mrad on the image field side.

Further mirror data of the projection optical unit 50 emerge from the following table.

Table 5 for FIG. 37/38

|  | M1 | M2 | M3 | M4 | M5 | M6 | M7 | M8 |
|---|---|---|---|---|---|---|---|---|
| Maximum angle of incidence [deg] | 20.9 | 81.9 | 83.8 | 7.0 | 79.8 | 81.2 | 17.2 | 8.3 |
| Extent of the mirror (x) [mm] | 525.7 | 662.4 | 847.1 | 984.1 | 675.6 | 325.0 | 482.9 | 1074.4 |
| Extent of the mirror (y) [mm] | 268.1 | 512.7 | 856.1 | 66.4 | 336.1 | 466.1 | 277.4 | 1053.4 |
| Maximum mirror diameter [mm] | 525.8 | 662.5 | 926.3 | 984.1 | 675.6 | 470.0 | 483.0 | 1076.0 |

There is an intermediate image 53a in the beam path in the region of a reflection on the mirror M5 in the yz-plane (FIG. 37) and in the imaging beam path region between the mirrors M6 and M7 in the xz-plane (FIG. 38).

A further pupil plane of the projection optical unit 50 is arranged in the region of the reflection of the imaging light 3 on the mirrors M7 and M8.

Aperture stops in the region of the mirrors M7 and M8 can be arranged distributed for the x-dimension, on the one hand, and for the y-dimension, on the other hand, at two positions in the imaging beam path, for example there can be an aperture stop for primarily providing a restriction along the y-dimension on the mirror M8 and an aperture stop for primarily providing a restriction along the x-dimension on the mirror M7.

The mirror M8 is obscured and includes a passage opening 54 for the passage of the illumination light 3 in the imaging beam path between the mirrors M6 and M7. Less than 20% of the numerical aperture of the projection optical unit 50 is obscured as a result of the passage opening 54. Thus, in a system pupil of the projection optical unit 50, a surface which is not illuminated due to the obscuration is less than $0.20^2$ of the surface of the overall system pupil. The non-illuminated surface within the system pupil can have a different extent in the x-direction than in the y-direction. Moreover, this surface in the system pupil which cannot be illuminated can be decentred in the x-direction and/or in the y-direction in relation to a centre of the system pupil.

Only the last mirror M8 in the imaging beam path includes a passage opening 54 for the imaging light 3. All other mirrors M1 to M7 have a continuous reflection surface. The reflection surface of the mirror M8 is used around the passage opening 54 thereof.

The mirrors M1, M3, M4, M6 and M8 have negative values for the radius, i.e. are, in principle, concave mirrors. The other mirrors M2, M5 and M7 have positive values for the radius, i.e. are, in principle, convex mirrors. The mirrors M2, M3, M5 and M6 for grazing incidence have very large radii and only constitute small deviations from plane reflection surfaces.

The reticle 12 and the wafer 19 are initially provided for producing a microstructured component, in particular a highly integrated semiconductor component, for example a memory chip, with the aid of the projection exposure apparatus 1. Subsequently, a structure on the reticle 8 is projected onto a light-sensitive layer on the wafer 19 with the projection optical unit of the projection exposure apparatus 1. By developing the light-sensitive layer, a microstructure is then generated on the wafer 19 and the microstructured or nanostructured component is generated therefrom.

What is claimed is:

1. An optical unit configured to illuminate an object field, the optical unit comprising:
   a first transmission optical unit configured to guide illumination light from a light source; and
   a facet mirror downstream of the first transmission optical unit, the facet mirror comprising a multiplicity of facets, the facet mirror configured to generate a illumination of the object field via an arrangement of facets,
   wherein:
   the optical unit is configured so that, during use of the optical unit, an illumination pupil of the optical unit is illuminated with an envelope deviating from a circular form;
   the envelope has a maximum extent so as to determine an illumination angle distribution in the object field;
   the illumination pupil is subdivided into a plurality of sub-pupil regions which are arranged in a line-by-line and/or column-by-column manner; and
   the optical unit is a microlithography illumination optical unit.

2. The optical unit of claim 1, wherein the facets are arranged in a pupil plane of the optical unit or in a plane conjugate to a pupil plane of the optical unit, and the facets are configured to determine the sub-pupil regions.

3. The optical unit of claim 1, wherein the illumination of the object field is determined via:
   an illuminable edge form of the facet mirror; and
   individual tilt angles of the facets.

4. The optical unit of claim 1, wherein the envelope has a maximum extent in a first dimension and a minimum extent in a second dimension, and a ratio of the maximum extent to the minimum extent is at least 1.1.

5. The optical unit of claim 1, wherein the sub-pupil regions of one of the columns are offset from one each other relative to the sub-pupil regions of an adjacent column by half the spacing of sub-pupil regions adjacent to one another within a column.

6. The optical unit of claim 5, wherein the sub-pupil regions have a hexagonal arrangement.

7. The optical unit of claim 5, wherein the sub-pupil regions have a rotated Cartesian arrangement.

8. The optical unit of claim 1, wherein the envelope is elliptical.

9. The optical unit of claim 8, wherein the sub-pupil regions have a hexagonal arrangement.

10. The optical unit of claim 9, wherein the facets are arranged in a pupil plane of the optical unit or in a plane conjugate to a pupil plane of the optical unit, and the facets are configured to determine the sub-pupil regions.

11. The optical unit of claim 8, wherein the facets are arranged in a pupil plane of the optical unit or in a plane conjugate to a pupil plane of the optical unit, and the facets are configured to determine the sub-pupil regions.

12. The optical unit of claim 8, wherein the sub-pupil regions have a maximum extent in a first dimension and a minimum extent in a second, and a ratio of the maximum extent to the minimum extent is at least 1.1.

13. The optical unit of claim 1, wherein the first transmission optical unit comprises a transmission facet mirror comprising a plurality of transmission facets.

14. The optical unit of claim 13, wherein an envelope of the transmission facet mirror has a maximum extent in a first dimension and a minimum extent in a second dimension, and a ratio of the maximum extent and the minimum extent is at least 1.1.

15. The optical unit of claim 14, further comprising a collector configured to generate an anamorphic image of the light source on the illumination pupil.

16. The optical unit of claim 15, further comprising a second transmission optical unit downstream of the facet mirror, wherein the second transmission optical unit is configured to generate the illumination pupil.

17. An optical system, comprising:
an optical unit according to claim 1; and
a projection optical unit configured to image the object field into an image field.

18. An illumination system, comprising:
a light source; and
an optical unit according to claim 1.

19. An apparatus, comprising:
a light source;
an optical unit according to claim 1; and
a projection optical unit configured to image the object field into an image field.

20. A method of using an apparatus that includes an illumination optical unit and a projection optical unit, the method comprising:
using the illumination optical unit to illuminate structures of a reticle; and
using the projection optical unit to image at least some of the illuminated structures of the reticle onto a light-sensitive material,
wherein the illumination optical unit comprises an optical unit according to claim 1.

21. The optical unit of claim 1, wherein the illumination light comprises EUV light.

* * * * *

UNITED STATES PATENT AND TRADEMARK OFFICE
CERTIFICATE OF CORRECTION

PATENT NO. : 9,897,924 B2  
APPLICATION NO. : 15/212664  
DATED : February 20, 2018  
INVENTOR(S) : Martin Endres Page 1 of 1

It is certified that error appears in the above-identified patent and that said Letters Patent is hereby corrected as shown below:

In the Specification

Column 4, Line 14: Delete "such" and insert -- Such --, therefor.

Column 19, Line 5: Delete "PP" and insert -- $\beta P$ --, therefor.

Column 15, Line 51: Delete "$38_x^i$" and insert -- $38_x^1$ --, therefor.

Column 15, Line 52: Delete "$38_y^i$" and insert -- $38_y^1$ --, therefor.

Signed and Sealed this  
Fifth Day of June, 2018

Andrei Iancu  
*Director of the United States Patent and Trademark Office*